(12) United States Patent
Noguchi et al.

(10) Patent No.: US 10,305,468 B2
(45) Date of Patent: May 28, 2019

(54) SEMICONDUCTOR DEVICE

(71) Applicant: Renesas Electronics Corporation, Tokyo (JP)

(72) Inventors: Koichiro Noguchi, Tokyo (JP); Koichi Nose, Tokyo (JP); Yoshifumi Ikenaga, Tokyo (JP); Yoichi Yoshida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/024,097

(22) Filed: Jun. 29, 2018

(65) Prior Publication Data
US 2018/0323779 A1 Nov. 8, 2018

Related U.S. Application Data

(63) Continuation of application No. 14/823,579, filed on Aug. 11, 2015, now Pat. No. 10,033,372.

(30) Foreign Application Priority Data

Aug. 27, 2014 (JP) .................................. 2014-172422

(51) Int. Cl.
*H03K 17/16* (2006.01)
*H02M 1/36* (2007.01)
(Continued)

(52) U.S. Cl.
CPC ............ *H03K 17/162* (2013.01); *H02M 1/36* (2013.01); *H02M 3/07* (2013.01); *H02M 3/155* (2013.01);
(Continued)

(58) Field of Classification Search
CPC ........... H02M 3/07; H02M 3/155; G05F 1/56; H03K 17/162; H02J 9/06; H02J 9/061; H02J 2009/068
(Continued)

(56) References Cited

U.S. PATENT DOCUMENTS 6,920,055 B1 * 7/2005 Zeng ....................... H02M 3/07
327/536
8,022,683 B2 * 9/2011 Thompson ............ H02M 3/158
323/284
(Continued)

FOREIGN PATENT DOCUMENTS

JP 2001-273043 A 10/2001
JP 2004-254461 A 9/2004
(Continued)

OTHER PUBLICATIONS

Communication dated Dec. 5, 2017 issued by the State Intellectual Property Office of the People's Republic of China in counterpart application No. 201510536660.6.
(Continued)

*Primary Examiner* — Fred E Finch, III
*Assistant Examiner* — Nusrat Quddus
(74) *Attorney, Agent, or Firm* — McDermott Will & Emery LLP

(57) ABSTRACT

According to one embodiment, a semiconductor device includes: a first switch SWx which switches whether or not to supply a first power supply voltage Vx generated by accumulating a charge outputted from a power source 10, as a second power supply voltage VDD to a first circuit 13, and a second switch SW1 which switches whether or not to connect to the first circuit 13 a smoothing capacitor C1 which suppresses a fluctuation of the second power supply voltage VDD, and the first switch SWx is switched to an on state in response to that the first power supply voltage Vx has reached a sufficient voltage, and then the second switch SW1 is switched to the on state in response to that the second power supply voltage VDD has reached a sufficient voltage.

9 Claims, 20 Drawing Sheets

(51) Int. Cl.
    H02M 3/07     (2006.01)
    H02M 3/155    (2006.01)
    *G05F 1/56*       (2006.01)
    *H02J 9/06*       (2006.01)
    *H03K 17/0814*    (2006.01)

(52) U.S. Cl.
    CPC .............. *G05F 1/56* (2013.01); *H02J 9/06* (2013.01); *H02J 9/061* (2013.01); *H02J 2009/068* (2013.01); *H03K 17/0814* (2013.01)

(58) Field of Classification Search
    USPC .......................................... 323/271–285, 315
    See application file for complete search history.

(56) References Cited

U.S. PATENT DOCUMENTS

| | | | |
|---|---|---|---|
| 8,319,375 | B2 | 11/2012 | Taniuchi |
| 8,872,384 | B2 * | 10/2014 | Stratakos ............... H02J 3/383 307/104 |
| 2008/0197817 | A1 | 8/2008 | Colbeck et al. |
| 2010/0253297 | A1 * | 10/2010 | Tseng ..................... G05F 1/56 323/281 |
| 2012/0146595 | A1 * | 6/2012 | Wong ..................... G05F 1/56 323/265 |
| 2012/0205978 | A1 * | 8/2012 | Wong ..................... G05F 1/56 307/31 |
| 2013/0229144 | A1 * | 9/2013 | Nagata ................. H02J 7/0072 320/107 |
| 2014/0085951 | A1 * | 3/2014 | Kaeriyama ............. H04B 3/50 363/126 |
| 2015/0338866 | A1 * | 11/2015 | Hu ........................ H02M 3/157 323/280 |
| 2016/0065070 | A1 * | 3/2016 | Noguchi ................. H02M 1/36 323/271 |
| 2016/0190926 | A1 * | 6/2016 | Ni ............................ G05F 1/56 323/271 |
| 2017/0085183 | A1 * | 3/2017 | Notsch .............. H02M 3/33507 |

FOREIGN PATENT DOCUMENTS

| | | |
|---|---|---|
| JP | 2007-89372 A | 4/2007 |
| JP | 2010-51082 A | 3/2010 |
| JP | 2010-166797 A | 7/2010 |

OTHER PUBLICATIONS

Communication dated May 8, 2018 from the Japanese Patent Office in counterpart Application No. 2014-172422.

Communication dated Aug. 20, 2018 from the State Intellectual Property Office of the P.R.C. in counterpart Chinese application No. 201510536660.6.

* cited by examiner

SEMICONDUCTOR DEVICE

CROSS-REFERENCE TO RELATED APPLICATIONS

This is a continuation of U.S. application Ser. No. 14/823,579 filed Aug. 11, 2015, which is based on and claims the benefit of priority from Japanese patent application No. 2014-172422, filed on Aug. 27, 2014, the disclosure of which is incorporated herein in its entirety by reference.

BACKGROUND

The present invention relates to a semiconductor device, and relates to, for example, a semiconductor device which assists a supply of power generated by a power source to a functional circuit.

A semiconductor device is provided with a smoothing capacitor between a power supply terminal and a ground terminal outside the semiconductor device to suppress a fluctuation of a power supply voltage. It is demanded that a power circuit which supplies power to the semiconductor device has capability to supply power including charges to be charged to this smoothing capacitor upon activation of the semiconductor device. Hence, upon activation of the semiconductor device, more power than that in a normal operation state is temporarily demanded. Hence, a technique of supplying power to a load circuit while charging a smoothing capacitor is disclosed in Japanese Unexamined Patent Application Publication No. 2001-273043.

In a power circuit disclosed in Japanese Unexamined Patent Application Publication No. 2001-273043, a smoothing capacitor converts the voltage obtained from a rectifier circuit into a direct current voltage, and a regulator IC stabilizes the direct current voltage. Further, a current bypass resistor is provided in parallel to the regulator IC.

SUMMARY

However, according to Japanese Unexamined Patent Application Publication No. 2001-273043, power needs to be supplied to both of the load circuit and the smoothing capacitor upon activation, and therefore there is a problem that a time (referred to as a start-up time below) that the load circuit takes to activate after a power supply from a power source starts becomes longer. The other tasks and new features will be more apparent from the description of the specification and the accompanying drawings.

According to one embodiment, a semiconductor device includes: a first switch that switches whether or not to supply a first power supply voltage generated by accumulating a charge outputted from a power supply, as a second power supply voltage to a first circuit; and a second switch that switches whether or not to connect to the first circuit a smoothing capacitor that suppresses a fluctuation of the second power supply voltage, and the first switch is switched to an on state in response to that the first power supply voltage has reached a sufficient voltage, and then the second switch is switched to the on state in response to that the second power supply voltage has reached a sufficient voltage.

In addition, a method and a system which are expressed by being replaced from the device according to the above embodiment is effective as aspects of the present invention.

According to the one embodiment, it is possible to shorten a start-up time of a semiconductor device while connecting a smoothing capacitor to the semiconductor device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
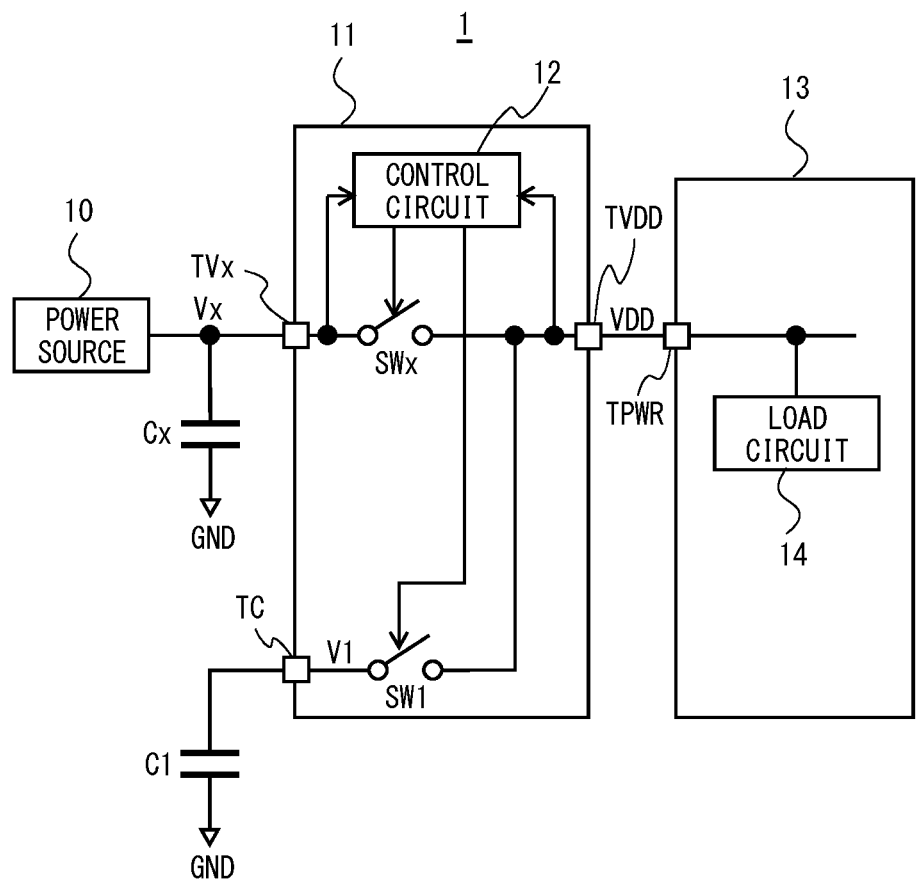
FIG. 1 is a block diagram of a semiconductor device according to a first embodiment.

For clarification of description, the following description and drawings will be optionally omitted and simplified. In addition, in each drawing, the same elements will be assigned the same reference numerals, and overlapping description thereof will be omitted when necessary.

FIG. 1 is a block diagram of a semiconductor device 1 according to the first embodiment. FIG. 1 illustrates an example of a system configured by a power source 10, a control chip 11, a control circuit 12, a charging capacitor Cx and a smoothing capacitor C1. Part of the power source 10, the control chip 11 and the control circuit 12 among these blocks are formed on a semiconductor chip. The example where the power source 10, the control chip 11 and the control circuit 12 are formed on individual chips will be described with reference to FIG. 1. However, circuits which can be formed on a semiconductor chip may be formed on one semiconductor chip. When a plurality of blocks described below are formed on semiconductor chips, a terminal described below as an external terminal is an internal terminal. In addition, the charging capacitor Cx and the smoothing capacitor C1 are provided to an outside of the semiconductor chip.

The power source 10 mainly outputs power for operating the control circuit 12. In the first embodiment, for the power source 10, a micropower source, such as a thermocouple, an antenna which receives a microwave or a solar cell under low light, which can only supply lower power such as several uW than a load circuit is used. That is, the semiconductor device 1 according to the first embodiment uses the power source 10 which collects energy obtained under environment and outputs the power. Further, the semiconductor device 1 accumulates charges outputted from the power source 10, in the charging capacitor Cx, and obtains a first power supply voltage Vx.

The control chip 11 includes the control circuit 12, a first switch (e.g. a switch SWx), a second switch (e.g. a switch SW1), a first terminal (e.g. an input terminal TVx), a second terminal (e.g. an output TVDD), and a third terminal (e.g. a smoothing capacitance connection terminal TC).

The input terminal TVx is connected with one end of the charging capacitor Cx. This charging capacitor Cx is connected between a ground terminal and a wiring which connects the power source 10 and the input terminal TVx. The output terminal TVDD is connected with one end of a power supply wiring which supplies a second power supply voltage VDD to a first circuit (e.g. a load chip 13). The smoothing capacitance connection terminal TC is connected with one end of the smoothing capacitor C1. The smoothing capacitor C1 is a capacitor which suppresses a fluctuation of the second power supply voltage VDD. The smoothing capacitor C1 is connected between the ground terminal and the smoothing capacitance connection terminal TC.

The switch SWx is connected between the input terminal TVx and the output terminal TVDD. A switch SW1 is connected between the output terminal TVDD and the smoothing capacitance connection terminal TC. The control circuit 12 controls an on/off state of the switch SWx and the switch SW1. More specifically, after switching the switch SWx from the off state to the on state, the control circuit 12 switches the switch SW1 from the off state to the on state in response to that the second power supply voltage VDD has satisfied certain conditions. Further, the control circuit 12 switches a switch SWz from the off state to the on state in response to that the first power supply voltage Vx has reached the first setting voltage, and switches the switch SWx from the off state to the on state in response to that the first power supply voltage Vx has reached a second setting value lower than the first setting value. Further, the control circuit 12 switches the switch SW1 from the off state to the on state in response to that the second power supply voltage VDD has reached a third setting voltage, and switches the switch SW1 from the off state to the on state in response to that the second power supply voltage VDD has reached a fourth setting voltage lower than the third setting voltage. The first setting voltage to the fourth setting voltage will be described in detail later.

In addition, in the first embodiment, an example where the control circuit 12 controls a switch based on voltage values of the first power supply voltage Vx and the second power supply voltage VDD will be described. However, the control circuit can control a switch based on an instruction from a timer or a load circuit 14 in the load chip 13.

The load chip 13 is a semiconductor chip on which a functional circuit (e.g. the load circuit 14) which realizes a function which needs to be performed by the semiconductor device 1 is formed. FIG. 1 illustrates a power supply terminal TPWR as a terminal of the load chip 13. However, the load chip 13 includes other terminals which are not illustrated, too.

Next, an operation of the semiconductor device 1 according to the first embodiment will be described. In addition, a state where a switch is in a block state will be expressed as an off state, and a state where a switch is conducted will be expressed as an on state below.

Figure 2:
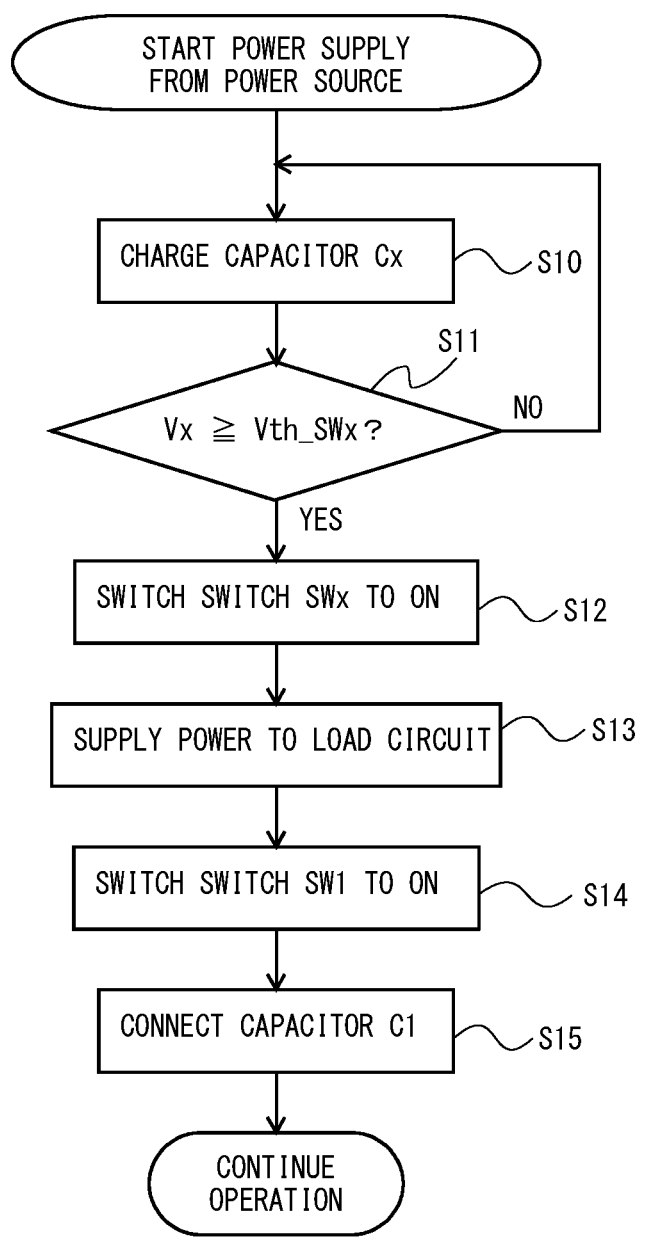
FIG. 2 is a flowchart for explaining an operation of the semiconductor device according to the first embodiment.

FIG. 2 is a flowchart for explaining an operation upon activation of the semiconductor device 1 according to the first embodiment. As illustrated in FIG. 2, the semiconductor device 1 according to the first embodiment charges the charging capacitor Cx in a state where the switches SWx and SW1 are switched to off states (a No branch in step S10 and step S11). Thus, the first power supply voltage Vx rises. Further, the switch SWx is switched to an on state (step S12) in response to that the first power supply voltage Vx has reached a first setting voltage Vth_SWx_ON or more (a Yes branch in step S11).

Further, when the switch SWx is switched to the on state, power supply to the load circuit 14 is started (step S13). Subsequently, the semiconductor device 1 switches the switch SW1 to the on state (step S14), and connects the smoothing capacitor C1 to the load chip 13 (step S15). Then, the semiconductor device 1 according to the first embodiment switches the switch SW1 from the off state to the on state in response to that the second power supply voltage VDD has reached a third setting voltage Vth_SW1_ON.

Figure 3:
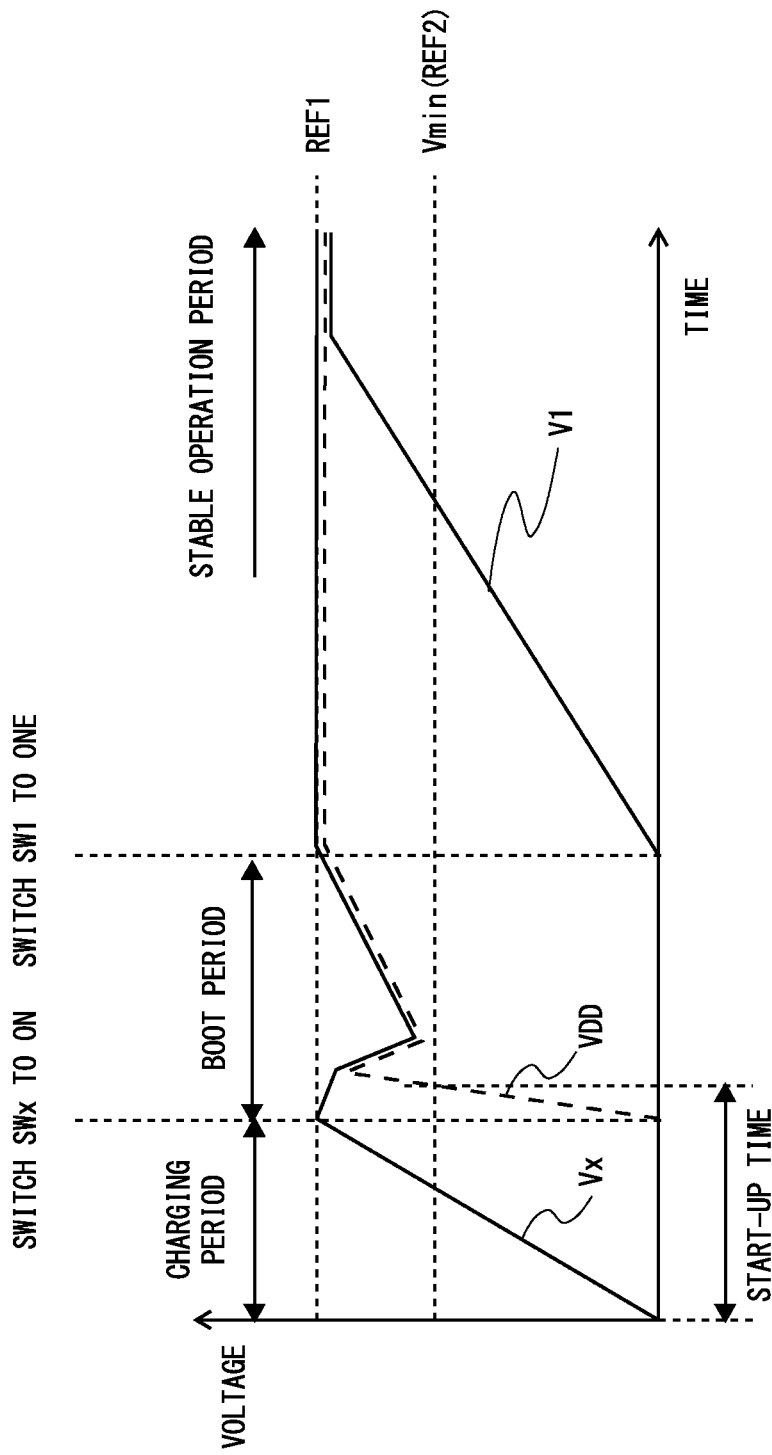
FIG. 3 is a timing chart for explaining the operation of the semiconductor device according to the first embodiment.

Next, an operation of the semiconductor device 1 according to the first embodiment will be described using a timing chart. FIG. 3 is the timing chart for explaining the operation upon activation of the semiconductor device 1 according to the first embodiment. FIG. 3 illustrates setting voltages REF1 and REF2. In the drawings including FIG. 3, the "boot period" means a period from when a power supply to a load circuit starts to when the operation of the load circuit is stabilized. Further, the "start-up time" means a period from when a power supply to the system starts to when the operation of the load circuit is stabilized. The first setting voltage Vth_SWx_ON and the third setting voltage Vth_SW1_ON correspond to the setting voltage REF1. The first setting voltage Vth_SWx_ON is a voltage higher than the third setting voltage Vth_SW1_ON. Further, a second setting voltage Vth_SWx_OFF and a fourth setting voltage Vth_SW1_OFF correspond to the setting voltage REF2. Furthermore, Vmin illustrated in FIG. 3 indicates a minimum operation power supply voltage of the load circuit 14. The second setting voltage Vth_SWx_ON is lower than the fourth setting voltage Vth_SW1_OFF, and is lower than the first setting voltage Vth_SWx_ON. Further, the second setting voltage Vth_SWx_OFF and the fourth setting voltage Vth_SW1_OFF are both voltages higher than the minimum operation power supply voltage Vmin.

The semiconductor device 1 according to the first embodiment performs control of maintaining the switch SWx in the on state until the first power supply voltage Vx reaches the first setting voltage Vth_SWx_ON and then lowers to the second setting voltage Vth_SWx_OFF. Further, the semiconductor device 1 according to the first embodiment performs control of maintaining the switch SW1 in the on state until the second power supply voltage VDD reaches the third setting voltage Vth_SW1_ON and then lowers to the fourth setting voltage Vth_SW1_OFF. In the timing chart illustrated in FIG. 3, a relationship between the setting voltage and the power supply voltage is simplified, and a fluctuation of each voltage such as a power supply voltage is focused upon.

As illustrated in FIG. 3, the semiconductor device 1 according to the first embodiment charges the charging capacitor Cx in a charging period, and raises the first power supply voltage Vx to the setting voltage REF1. Further, the switch SWx is switched to the on state in response to that the first power supply voltage Vx has reached the first setting voltage Vth_SWx_ON. Thus, the charging period is switched to a start-up time.

During the start-up time, the second power supply voltage VDD is applied to the load circuit 14 through the switch SWx. In this case, the second power supply voltage VDD gradually rises from 0 V based on charges accumulated in the charging capacitor Cx and power outputted from the power source 10. Meanwhile, during the boot period, the first power supply voltage Vx lowers since the charge amount accumulated in the charging capacitor Cx decreases. Subsequently, when power supply to the load circuit 14 is satisfied to some degree, the first power supply voltage Vx and the second power supply voltage VDD rise.

Further, the semiconductor device 1 switches the switch SW1 from the off state to the on state in response to that the second power supply voltage VDD has reached the third setting voltage Vth_SW1_ON. Thus, the smoothing capacitor C1 is connected to the load chip 13, and the semiconductor device 1 transitions to a stable operation period. The stable operation period refers to a period in which the smoothing capacitor C1 operates in a state where the smoothing capacitor C1 is connected to the load chip 13. In this case, a voltage V1 produced by charges charged to the smoothing capacitor C1 rises as the time passes. When the voltage V1 is charged to the same voltage as the second power supply voltage VDD, the smoothing capacitor C1 starts functioning as the smoothing capacitor C1 of the load circuit.

Figure 4:
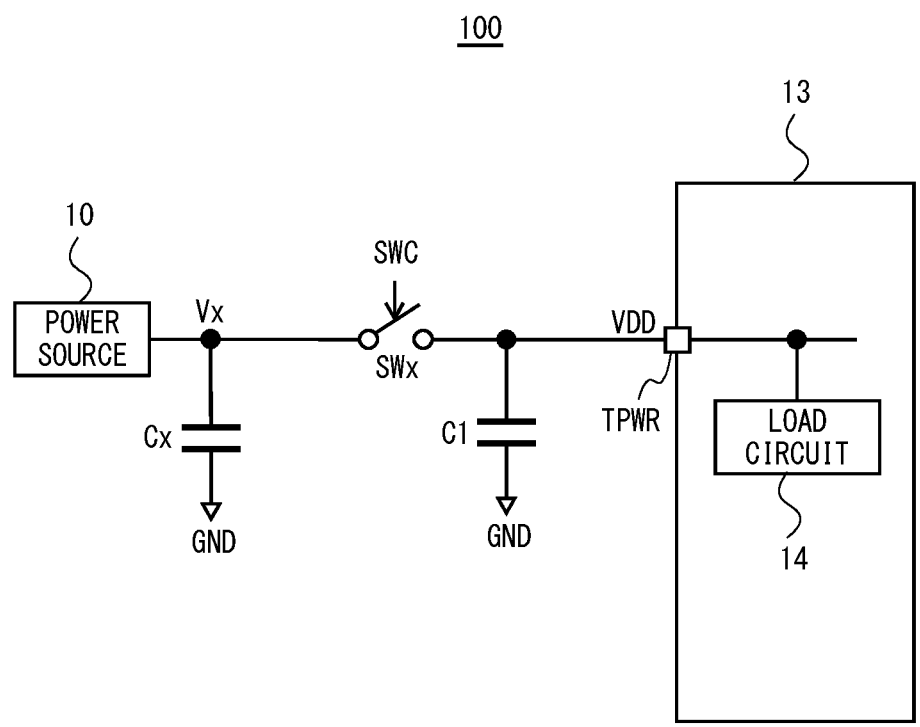
FIG. 4 is a block diagram for explaining a comparative example of the semiconductor device according to the first embodiment.

Hereinafter, a semiconductor device 100 according to a comparative example will be described to further clarify the operation of the semiconductor device 1 according to the first embodiment. FIG. 4 is a block diagram of the semiconductor device 100 according to the comparative example.

As illustrated in FIG. 4, in the semiconductor device 100 according to the comparative example, the switch SWx is provided on a power supply wiring which connects the power source 10 and the load chip 13. Further, the charging capacitor Cx is provided between a ground terminal and the wiring which connects the switch SWx and the power source 10. The smoothing capacitor C1 is provided between the ground terminal and the wiring which connects the switch SWx and the load chip 13. Further, in the semiconductor device 100 according to the comparative example, the switch SWx switches from the off state to the on state in response to that the first power supply voltage Vx has reached the first setting voltage Vth_SWx_ON. That is, in the semiconductor device 100, power is supplied to the load chip 13 by using the control circuit 12 of the semiconductor device 1 according to the first embodiment.

Figure 5:
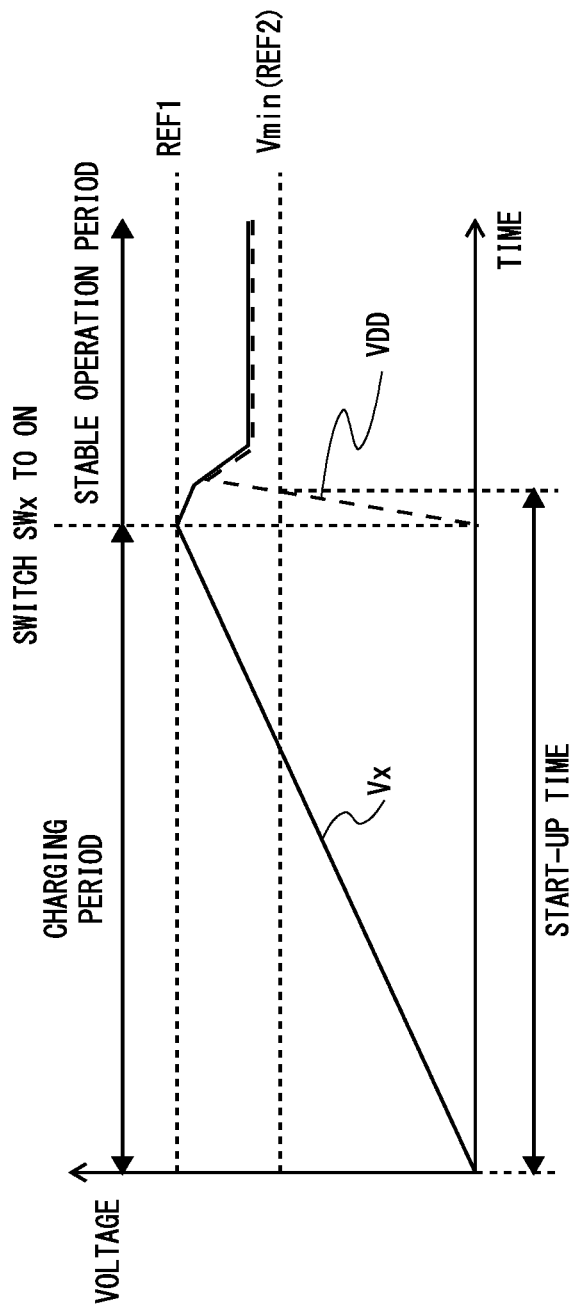
FIG. 5 is a timing chart for explaining an operation of the comparative example of the semiconductor device according to the first embodiment.

Next, an operation of the comparative example will be described with reference to a timing chart. FIG. 5 is a timing chart for explaining the operation of the semiconductor device 100 according to the comparative example. In addition, the setting voltages REF1 and REF2 in FIG. 5 correspond to the same voltage as the setting voltage described with reference to FIG. 3.

As illustrated in FIG. 5, the semiconductor device 100 according to the comparative example transitions from a charging period to a stable operation period in response to that the first power supply voltage Vx has reached the first setting voltage Vth_SWx_ON. Hence, in the semiconductor device 100 according to the comparative example, the second power supply voltage VDD rises at the beginning of the stable operation period.

Upon comparison of the operation of the semiconductor device 1 according to the first embodiment described with reference to FIG. 3 and the operation of the semiconductor device 100 according to the comparative example described with reference to FIG. 5, the semiconductor device 1 according to the first embodiment takes a shorter time which passes until the second power supply voltage VDD reaches the minimum operation power supply voltage Vmin. That is, the semiconductor device 1 according to the first embodiment can shorten a start-up time of the load chip 13 by using the control chip 11. Next, an effect obtained by reducing the start-up time will be described below in more detail.

First, a relationship between charging energy of the smoothing capacitor C1 and activation energy of the load chip 13 will be described. Eboot is defined as the activation energy of the load chip 13 below. Further, in the following description, C1 represents a capacitance value of the smoothing capacitor C1, Vmin represents a minimum operation power supply voltage of the load chip 13 and Vth_SWx_ON represents a first setting voltage. Further, Cprop represents a capacitance value of the charging capacitor Cx of the semiconductor device 1 according to the first embodiment, and Ccomp represents a capacitance value of the charging capacitor Cx of the semiconductor device 100 according to the comparative example.

Equation (1) and equation (2) are derived from a relational equation of the charging energy of the smoothing capacitor C1 and the activation energy of the load chip 13 according to the definition.

[Mathematical 1]

$$Ccomp \cdot \frac{(Vth\_SWx\_ON^2 - Vmin^2)}{2} \geq Eboot + C1 \cdot \frac{Vmin^2}{2} \quad (1)$$

[Mathematical 2]

$$Cprop \cdot \frac{(Vth\_SWx\_ON^2 - Vmin^2)}{2} \geq Eboot \quad (2)$$

Equation (1) indicates a relationship of energy in the semiconductor device 100 described in the comparative example. The left side indicates energy used upon activation of the load chip 13 among energy accumulated in the charging capacitor Cx. More specifically, since, even when energy up to the voltage Vth_SWx_ON is charged to the charging capacitor Cx, only energy corresponding to the voltage equal to or more than Vmin which is the minimum operation voltage of the load chip can be used, and such an equation is as expressed above. Meanwhile, the right side indicates energy required to activate the load chip 13. More specifically, the smoothing capacitor C1 is configured to be connected to the load chip, and therefore energy required to activate the load chip 13 requires the energy Eboot required to activate the load chip 13, and, in addition, energy for charging the smoothing capacitor C1 to the minimum operation voltage of the load chip. Equation (2) indicates the relationship of energy in the semiconductor device 1 according to the first embodiment, and a calculation ground is the same as that in equation (1). Upon comparison of equation (1) and equation (2), the semiconductor device 1 according to the first embodiment does not have a term of C1 in the left side. This is because, in the semiconductor device 1 according to the first embodiment, the smoothing capacitor C1 and the load chip 13 are isolated upon activation of the load chip 13. Further, when the power supply voltage of the load chip 13 is Vmin or less, a phenomenon that an activation sequence of the load chip 13 stops occurs. Hence, equation (1) and equation (2) indicate that, when the energy (left side) which can be used to activate the load chip 13 among the energy accumulated in the charging capacitor Cx is not higher than the energy (right side) required to activate the load chip 13, the load chip 13 cannot be activated.

Next, capacitance values of the charging capacitors Cx of the semiconductor device 1 according to the first embodiment and the semiconductor device 100 according to the comparative example are derived by using equation (1) and equation (2) to compare the capacitance values of the charging capacitors Cx which are deeply related to a start-up time. The capacitance values are obtained by deriving equation (3) and equation (4) from equation (1) and equation (2).

[Mathematical 3]

$$Ccomp \geq 2 \cdot \left\{ Eboot + \frac{C1 \cdot Vmin^2}{2} \right\} \Big/ (Vth\_SWx\_ON^2 - Vmin^2) \quad (3)$$

[Mathematical 4]

$$Cprop \geq 2 \cdot Eboot / (Vth\_SWx\_ON^2 - Vmin^2) \quad (4)$$

Equation (3) indicates the capacitance value of the charging capacitor Cx of the semiconductor device 100 according to the comparative example, and equation (4) indicates the capacitance value of the charging capacitor Cx of the semiconductor device 1 according to the first embodiment. The activation energy Eboot of the load chip 13, the minimum activation power supply voltage Vmin of the load chip 13 and the capacitance value of the smoothing capacitor C1 in equation (3) and equation (4) are the same in the semiconductor device 1 according to the first embodiment and the semiconductor device 100 according to the comparative example, and therefore it is found that the capacitance value Ccomp expressed by equation (3) is higher than Cprop expressed by equation (4). By deriving the relationship between the charging capacitors Cx from equation (3) and equation (4), a relationship of equation (5) is obtained.

[Mathematical 5]

$$Ccomp \geq Cprop \quad (5)$$

Equation (5) shows that, when the load chips 13, the smoothing capacitors C1 and the first setting voltages Vth_SWx_ON are under the same conditions, the charging capacitor Cx of the semiconductor device 1 according to the first embodiment is smaller than the charging capacitor Cx of the semiconductor device 100 according to the comparative example. In other words, the charging capacitor Cx of the semiconductor device 1 according to the first embodiment can adopt a product of a lower capacitance value than that of the charging capacitor Cx of the semiconductor device 100 according to the comparative example.

Lastly, energy amounts which need to be accumulated in the charging capacitors Cx to activate the load chip 13 are derived for the semiconductor device 1 according to the first embodiment and the semiconductor device 100 according to the comparative example to compare charging times. These energy amounts can be derived as equation (6) and equation (7) from equation (1) and equation (2).

[Mathematical 6]

$$Ccomp \cdot \frac{Vth\_SWx\_ON^2}{2} \geq Eboot + Ccomp \cdot \frac{Vmin^2}{2} + C1 \cdot \frac{Vmin^2}{2} \quad (6)$$

[Mathematical 7]

$$Cprop \cdot \frac{Vth\_SWx\_ON^2}{2} \geq Eboot + Cprop \cdot \frac{Vmin^2}{2} \quad (7)$$

The left side indicates energy accumulated in the charging capacitor Cx. Upon comparison of equation (6) and equation (7), the first terms of the right sides are common, the second term of the right side of equation (7) is smaller than that of equation (6) and the third term of the right side of equation (7) is smaller by $C1 \cdot (Vmin^2)/2$. In view of this, the semiconductor device 1 according to the first embodiment requires lower energy for activation. The start-up time (i.e., the time which passes until the load circuit is activated after charging starts) is equal to the charging time which passes until the energy amounts expressed by equation (6) and equation (7) are charged. That is, it can be confirmed in view of equation (6) and equation (7) that the semiconductor device 1 according to the first embodiment can shorten the time which passes until the load chip 13 is activated.

In this regard, a relationship between the capacitance values of the charging capacitors Cx and a relationship between start-up times will be described by substituting specific values in equation (1) to equation (7). In the following description, the energy amount Eboot required to activate the load chip 13 is 10 µJ (corresponding to an energy amount for consuming 1 mA at 2 V during 5 msec), the minimum operation power supply source of the load chip 13 is 2 V, the capacitance value of the smoothing capacitor C1 is 10 µF and the first setting voltage Vth_SWx_ON for switching the switch SWx to the on state is 3 V.

First, the capacitance value of the charging capacitor Cx of the semiconductor device 100 according to the comparative example is calculated as 12 µF by substituting the above conditions in equation (3). Further, the capacitance value of the charging capacitor Cx of the semiconductor device 1 according to the first embodiment is calculated as 4 µF by substituting the above conditions in equation (4). That is, by using the semiconductor device 1 according to the first embodiment, it is possible to reduce the capacitance value of the charging capacitor Cx.

Further, the energy amount which needs to be accumulated in the charging capacitor Cx to activate the load chip 13 in the semiconductor device 100 according to the comparative example is calculated as 54 µJ by using the calculated capacitance value of the charging capacitor Cx and equation (6). Furthermore, the energy amount which needs to be accumulated in the charging capacitor Cx to activate the load chip 13 in the semiconductor device 1 according to the first embodiment is 18 µJ by using the calculated capacitance value of the charging capacitor Cx and equation (7).

In this regard, when a current outputted from the power source 10 is 100 μA, the semiconductor device 100 according to the comparative example needs 540 msec to activate the load chip 13. Meanwhile, the semiconductor device 1 according to the first embodiment needs 180 msec which is the time required to activate the load chip 13. In this specific example, the semiconductor device 1 according to the first embodiment can reduce a start-up time by 66% compared to the semiconductor device 100 according to the comparative example.

Subsequently, a method of optimally setting a parameter such as a first setting voltage in the semiconductor device 1 according to the first embodiment will be studied. First, the first setting voltage Vth_SWx_ON and the third setting voltage Vth_SW1_ON will be described. Focusing upon equation (2), the minimum operation power supply voltage Vmin and the activation energy Eboot are parameters uniquely determined based on the specification of the load chip 13, and parameters which can be freely set are Vth_SWx_ON and the capacitance value of the charging capacitor Cx. Further, when the right side is larger than the left side in equation (2), it is necessary to change a combination of two methods of a method of increasing the first setting voltage Vth_SWx_ON and a method of increasing the capacitance value of the charging capacitor Cx to satisfy the numerical relation of equation (2).

In this regard, the left side of equation (2) will be focused upon to clarify that adjusting which parameter is more effective. While $Cprop \cdot (Vth\_SWx\_ON^2)/2$ of the first term is total energy which is accumulated in the charging capacitor Cx, $Cprop \cdot (Vmin^2)/2$ of the second term is energy which is not used to activate the load chip 13. This is because, when the second power supply voltage VDD is not the minimum operation power supply voltage Vmin or more, the energy cannot be used to activate the load chip 13. Hence, a rate (Ef_Eboot) of energy which is effective for activation and occupies in total energy to be accumulated in the charging capacitor Cx is calculated. This energy rate Ef_Eboot is derived as equation (8) from the left side of equation (2).

[Mathematical 8]

$$\text{Ef\_Eboot} = \left(\frac{Cprop \cdot Vth\_SWx\_ON^2}{2} - \frac{Cprop \cdot Vmin^2}{2}\right) \bigg/ \left(\frac{Cprop \cdot Vth\_SWx\_ON^2}{2}\right) \quad (8)$$

$$= 1 - \frac{Vmin^2}{Vth\_SWx\_ON^2}$$

That is, when the first setting voltage Vth_SW1_ON is made higher, the second term $(Vmin^2/Vth\_SWx\_ON^2)$ of the right side of equation (8) becomes smaller, and the rate of energy used for activation is higher. Meanwhile, when the capacitance value of the charging capacitor Cx is made higher, while energy of equation (2) used for activation increases, energy $(Cprop \cdot (Vmin^2)/2)$ which cannot be used for activation also increases, and the rate of the energy amount which is used for activation and occupies in the total energy amount does not change. In view of the above, the semiconductor device 1 according to the first embodiment preferably reduces the energy amount which is not used for activation by reducing the capacitance value of the charging capacitor Cx while enhancing efficiency as much as possible by setting the high first setting voltage Vth_SWx_ON. More specifically, a maximum value of the first setting voltage Vth_SWx_ON is preferably a maximum output voltage Vmax outputted from the power source 10.

Subsequently, the third setting voltage Vth_SW1_ON will be described. When the third setting voltage Vth_SW1_ON is set to a value lower than the minimum operation power supply voltage Vmin of the load chip 13, the smoothing capacitor C1 does not function as a stabilizing capacitor. Meanwhile, when the third setting voltage Vth_SW1_ON is set to the maximum output voltage Vmax of the power source 10 or more, the switch SW1 is not switched to the on state, the smoothing capacitor C1 is not connected to the load chip 13 and therefore an operation failure occurs. Hence, the third setting voltage Vth_SW1_ON is preferably set between Vmin<Vth_SW1_ON<Vmax. In addition, when a temporal fluctuation of power consumption of the load chip 13 is little, the third setting voltage Vth_SW1_ON is set to a low voltage, and, when a temporal change is significant, it is possible to stabilize an operation by setting the third setting voltage Vth_SW1_ON to a high voltage.

In addition, voltages of the second setting voltage Vth_SWx_OFF and the fourth setting voltage Vth_SW1_OFF are preferably set as Vmin<Vth_SWx_OFF<Vth_SW1_OFF. This is because the switch SW1 is switched between on and off states in a state where the switch SWx maintains the on state to avoid that a stable operation state is over during the operation of the load chip 13.

As described above, the semiconductor device 1 according to the first embodiment can shorten the start-up time of the load chip 13 by providing the control chip 11. Particularly when a micropower source whose output power is low is used for the power source 10, the start-up time of the load chip 13 is highly likely to increase. Hence, providing the control chip 11 in the system which supplies power from such a micropower source and reducing the start-up time are significantly effective.

Further, the semiconductor device 1 according to the first embodiment can reduce the capacitance value of the charging capacitor Cx. In recent years, not only semiconductor chips but also mounting substrates which are mounted on semiconductors are remarkably minimized, so that making part sizes smaller brings a significant effect of reducing the capacitance value of the charging capacitor Cx.

Second Embodiment

Figure 6:
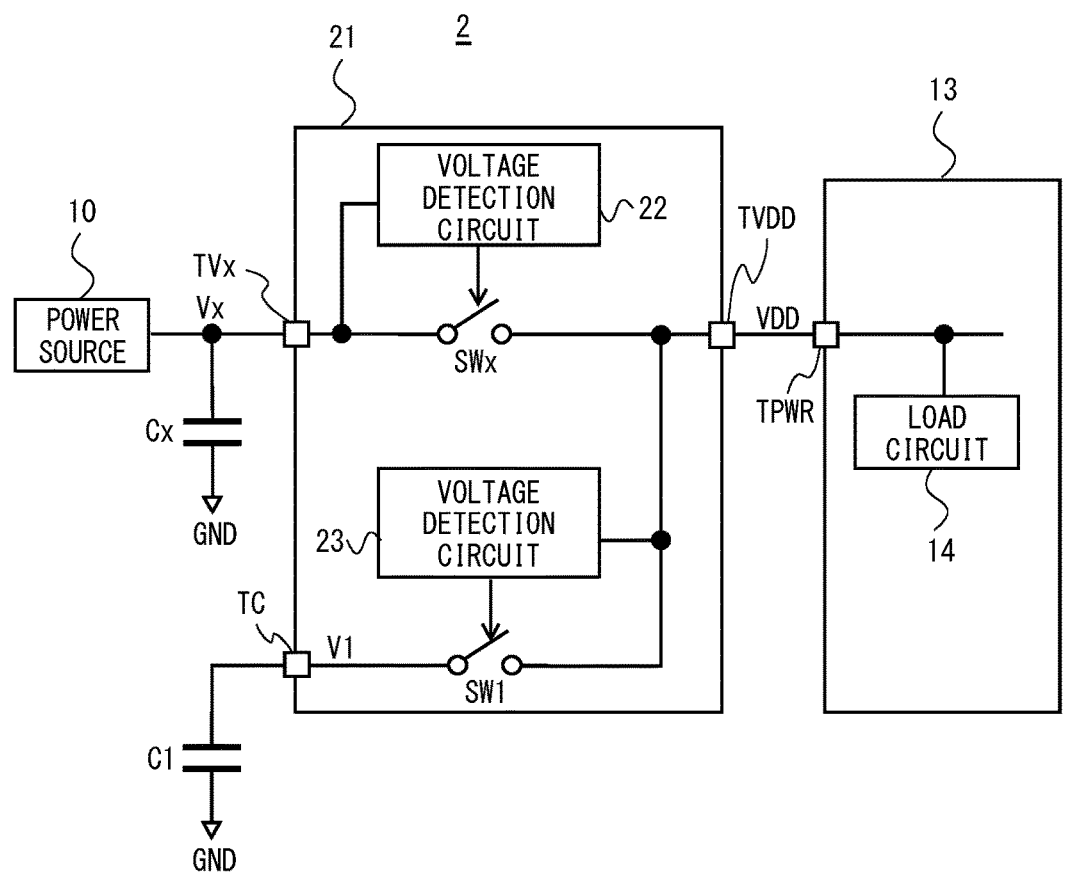
FIG. 6 is a block diagram of a semiconductor device according to a second embodiment.

An example of a control circuit 12 of a semiconductor device 1 according to the first embodiment will be described in the second embodiment. FIG. 6 is a block diagram of a semiconductor device 2 according to the second embodiment. As illustrated in FIG. 6, the semiconductor device 2 according to the second embodiment includes a control chip 21 instead of a control chip 11. Further, the control chip 21 includes a first voltage detection circuit (e.g. a voltage detection circuit 22) and a second voltage detection circuit (e.g. a voltage detection circuit 23) as the control circuit 12.

The voltage detection circuit 22 controls a switch SWx in an on state until a voltage of a first power supply voltage Vx reaches a first setting voltage Vth_SWx_ON and then reaches a second setting voltage Vth_SWx_OFF lower than the first setting voltage Vth_SWx_ON. The voltage detection circuit 23 controls a switch SW1 in the on state until a voltage of a second power supply voltage VDD reaches a third setting voltage Vth_SW1_ON and then reaches a fourth setting voltage Vth_SW1_OFF lower than the third setting voltage Vth_SW1_ON.

Figure 7:
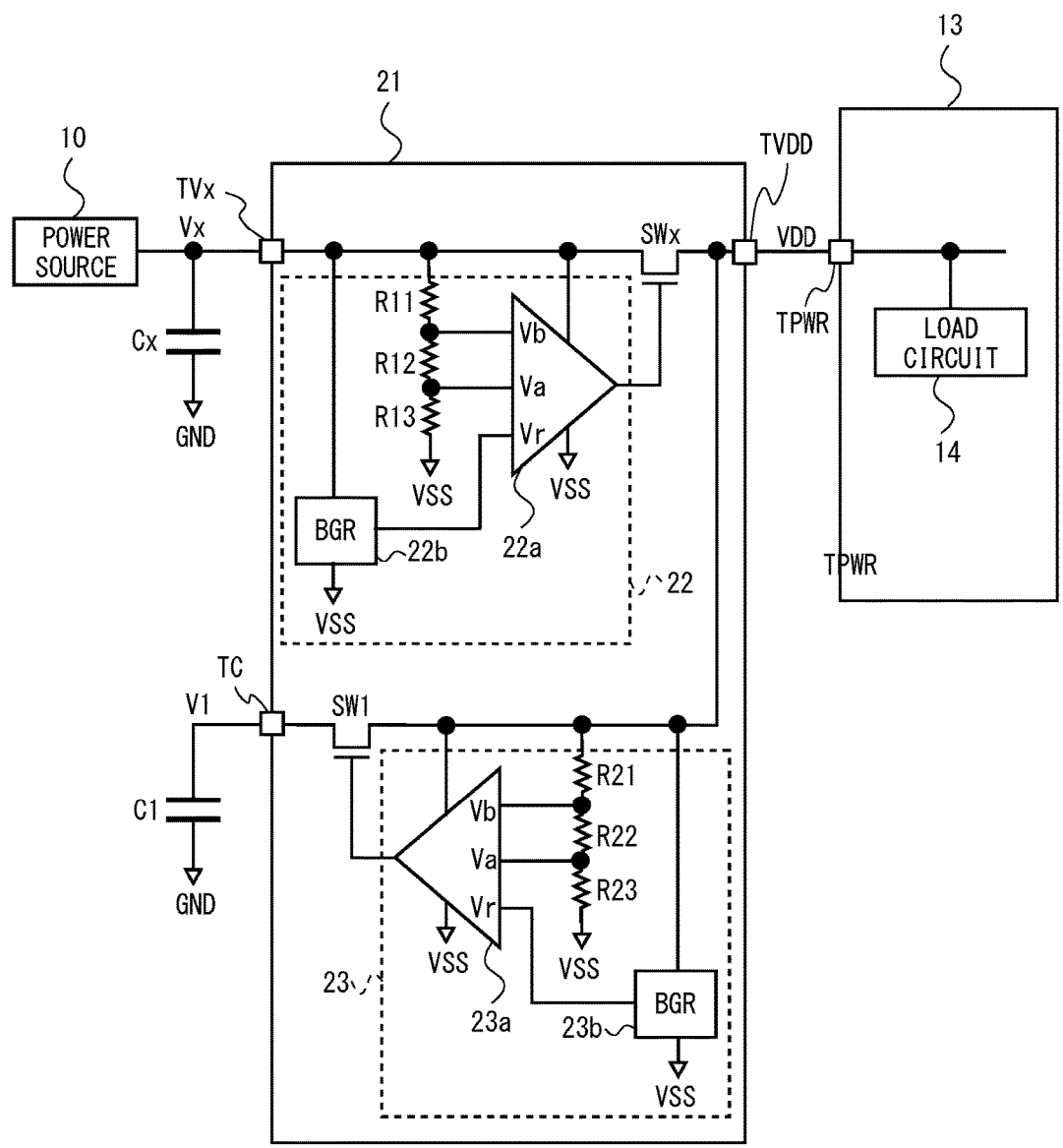
FIG. 7 is a block diagram of details of the semiconductor device according to the second embodiment.

FIG. 7 is a block diagram illustrating details of the semiconductor device 2 according to the second embodiment in detail. FIG. 7 illustrates specific circuits of the voltage detection circuits 22 and 23. Further, FIG. 7 illustrates an example where NMOS transistors are used as the switches SWx and SW1.

As illustrated in FIG. 7, the voltage detection circuit 22 includes a comparator 22a, a constant voltage source 22b and resistors R11 to R13. The comparator 22a and the constant voltage source 22b operate based on the first power supply voltage Vx. The constant voltage source 22b outputs a reference voltage Vr. The resistors R11 to R13 are connected in series between a ground terminal and a wiring which receives a supply of the first power supply voltage Vx. Further, the resistors R11 to R13 output voltages Va and Vb obtained by dividing the first power supply voltage Vx, from a node which connects the resistor and the resistor. The voltage Va is a voltage which reaches the reference voltage Vr at a point of time at which the first power supply voltage Vx reaches the first setting voltage Vth_SWx_ON. The voltage Vb is a voltage which reaches the reference voltage Vr at a point of time at which the first power supply voltage Vx reaches the second setting voltage Vth_SWx_OFF. The comparator 22a switches the switch SWx from the off state to the on state in response to that the voltage Va has exceeded the reference voltage Vr. Further, after switching the switch SWx to the on state, the comparator 22a switches the switch SWx from the on state to the off state in response to that the voltage Vb has gone below the reference voltage Vr. That is, the comparator 22a functions as a hysteresis comparator having two different thresholds with respect to the first power supply voltage Vx.

The voltage detection circuit 23 includes a comparator 23a, a constant voltage source 23b and resistors R21 to R23. The comparator 23a and the constant voltage source 23b operate based on the second power supply voltage VDD. The constant voltage source 23b outputs the reference voltage Vr. The resistors R21 to R23 are connected in series between the ground terminal and the wiring which receives a supply of the second power supply voltage VDD. Further, the resistors R21 to R23 output the voltages Va and Vb obtained by dividing the second power supply voltage Vx, from a node which connects the resistor and the resistor. The voltage Va is a voltage which reaches the reference voltage Vr at a point of time at which the second power supply voltage VDD reaches the third setting voltage Vth_SW1_ON. The voltage Vb is a voltage which reaches the reference voltage Vr at a point of time at which the second power supply voltage VDD reaches the fourth setting voltage Vth_SW1_OFF. The comparator 23a switches the switch SW1 from the off state to the on state in response to that the voltage Va has exceeded the reference voltage Vr. Further, after switching the switch SW1 to the on state, the comparator 23a switches the switch SW1 from the on state to the off state in response to that the voltage Vb has gone below the reference voltage Vr. That is, the comparator 23a functions as a hysteresis comparator having two different thresholds with respect to the second power supply voltage VDD.

In addition, the same reference numerals (Va and Vb) are assigned to the voltage supplied to the comparator 22a and the voltage supplied to the comparator 23a in FIG. 7. However, the voltages Va and Vb supplied to the comparator 22a and the voltages Va and Vb supplied to the comparator 23a are different voltages. A resistance ratio of the resistors R11 to R13 and a resistance ratio of the resistors R21 to R23 are different.

Figure 8:
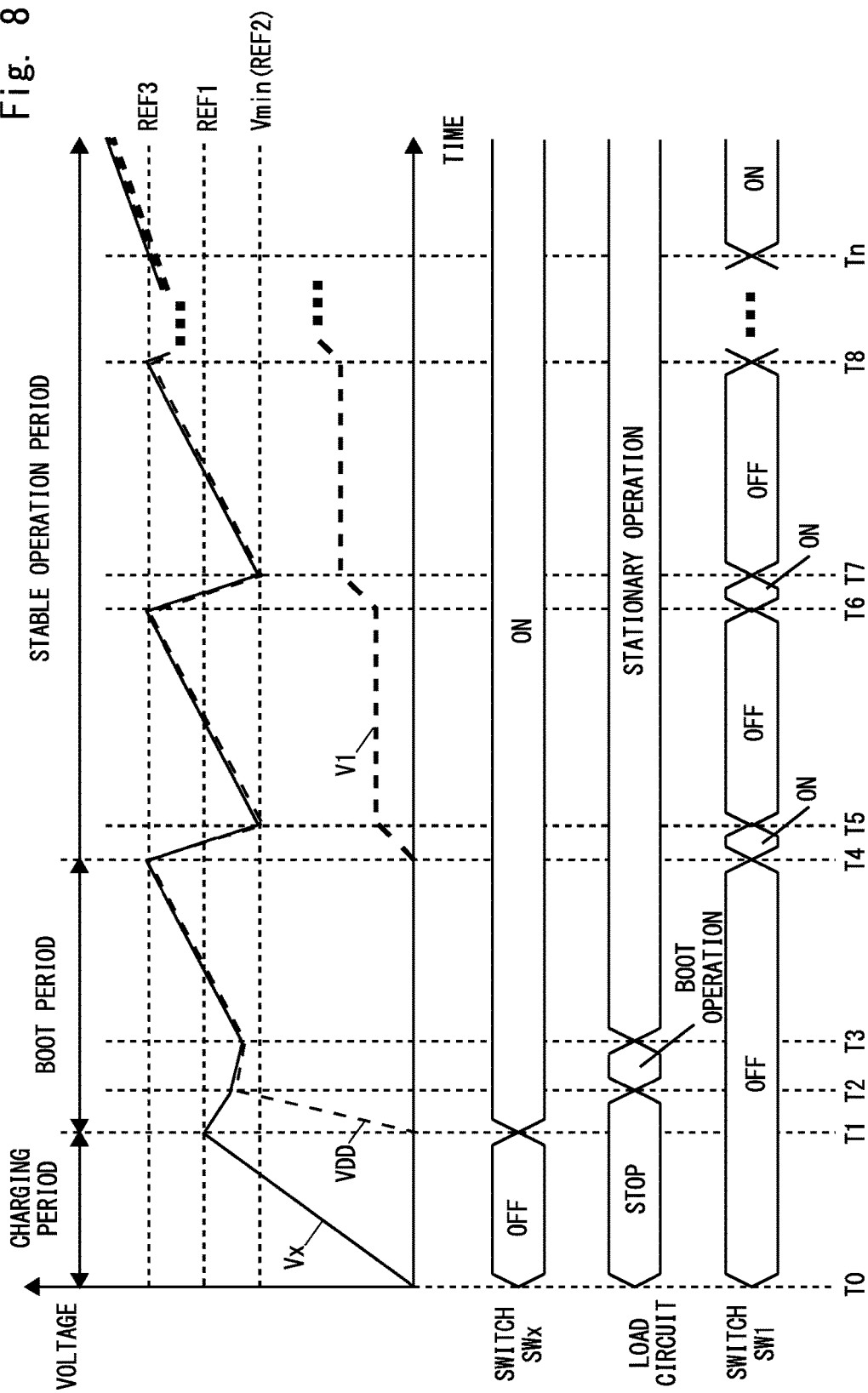
FIG. 8 is a timing chart for explaining an operation of the semiconductor device according to the second embodiment.

Next, an operation of the semiconductor device 2 according to the second embodiment will be described. FIG. 8 is a timing chart for explaining the operation of the semiconductor device 2 according to the second embodiment. Setting voltages REF1, REF2 and REF3 are indicated in the timing chart illustrated in FIG. 8. The setting voltage REF1 is a voltage corresponding to the first setting voltage Vth_SWx_ON. The setting voltage REF2 is a voltage corresponding to the second voltage Vth_SWx_OFF and the fourth setting voltage Vth_SW1_OFF. In this regard, the second setting voltage Vth_SWx_OFF is a voltage higher than the fourth setting voltage Vth_SW1_OFF. The setting voltage REF3 is a voltage corresponding to the third setting voltage Vth_SW1_ON. In the example illustrated in FIG. 8, Vth_SWx_ON<Vth_SW1_ON holds.

In the example illustrated in FIG. 8, a power source 10 starts charging a charging capacitor Cx at a timing T0. In this charging period, the switches SWx and SW1 are in off states. Hence, power is not supplied to the load chip 13 in the charging period, and the load chip 13 is placed in a fatal state.

Further, when the first power supply voltage Vx reaches the first setting voltage Vth_SWx_ON at a timing T1, the switch SWx is switched from the off state to the on state. Thus, power supply to a load chip 13 is started. In a rising period of the second power supply voltage VDD from the timing T1 to a timing T2, power to be supplied to the load chip 13 increases, and therefore charges of the charging capacitor Cx decrease and the first power supply voltage Vx lowers. Further, the load chip 13 starts activation processing at the timing T2. In this activation processing, power consumption of the load chip 13 becomes high, and therefore the first power supply voltage Vx and the second power supply voltage VDD in a period to a timing T3 at which the activation processing is finished lower. Further, when the activation is finished at the timing T3, the power consumption of the load chip 13 lowers, and therefore the first power supply voltage Vx and the second power supply voltage VDD rise as a result of output of power from the power source 10. In addition, in a subsequent period, the first power supply voltage Vx and the second power supply voltage VDD show the same voltage fluctuation.

Further, when the second power supply voltage VDD reaches the third setting voltage Vth_SW1_ON at a timing T4, the semiconductor device 1 switches the switch SW1 from the off state to the on state. Thus, a smoothing capacitor C1 is connected to the load chip 13, and the smoothing capacitor C1 is charged. When the smoothing capacitor C1 is charged, a voltage V1 produced at one end of the smoothing capacitor C1 rises. Further, when the second power supply voltage VDD reaches the fourth setting voltage Vth_SW1_OFF at a timing T5, the semiconductor device 1 switches the switch SW1 from the on state to the off state. Thus, a charge current stops flowing to the smoothing capacitor C1, and then the second power supply voltage VDD rises again from the timing T5. Further, when the second power supply voltage VDD reaches the third setting voltage Vth_SW1_ON again at a timing T6, the smoothing capacitor C1 is charged. Subsequently, the semiconductor device 1 keeps charging the smoothing capacitor C1 while repeating the operation in the period from the timing T4 to the timing T6.

Subsequently, even when the second power supply voltage VDD reaches the third setting voltage Vth_SW1_ON at a timing Tn and the switch SW1 enters the on state, the smoothing capacitor C1 is sufficiently charged and the voltage V1 is the substantially same voltage as the second power supply voltage VDD, and therefore the switch SW1 subsequently maintains the on state.

As described above, the semiconductor device 2 according to the second embodiment has the voltage detection circuits 22 and 23 which are the specific examples of the control circuit 12. Thus, it is possible to control the switches SWx and SW1 according to voltage values of the first power supply voltage VDD and the second power supply voltage VDD by using the voltage detection circuits 22 and 23.

Further, the semiconductor device 2 according to the second embodiment has set the third setting voltage Vth_SW1_ON higher than the first setting voltage Vth_SWx_ON. By setting the voltages in this way, it is possible to reduce a charging time of the smoothing capacitor C1 while shortening a start-up time.

Third Embodiment

Figure 9:
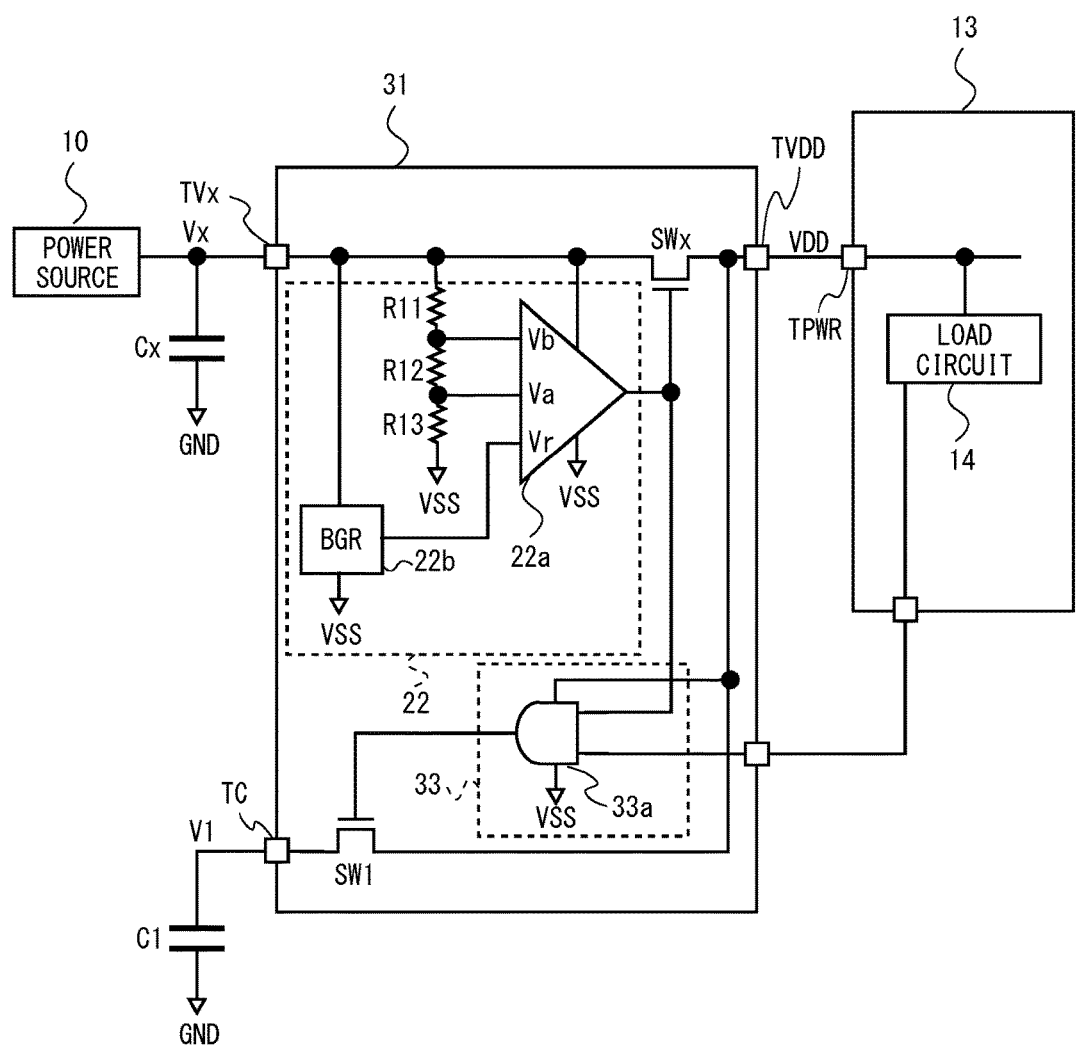
FIG. 9 is a block diagram of a semiconductor device according to a third embodiment.

Another example of a control circuit 12 of a semiconductor device 1 according to the first embodiment will be described in the third embodiment. FIG. 9 is a block diagram of a semiconductor device 3 according to the third embodiment. As illustrated in FIG. 9, the semiconductor device 3 according to the third embodiment includes a control chip 31 instead of a control chip 11. Further, the control chip 31 includes a voltage detection circuit 22 and a capacitance connection determination circuit 33 as the control circuit 12. In addition, the voltage detection circuit 22 is the same as that described together with a semiconductor device 2 according to the second embodiment.

The capacitance connection determination circuit 33 controls a switch SW1 in an on state in response to that the voltage detection circuit 22 has switched a switch SWx to an on state and in response to reception of an activation notification signal for notifying that activation has been finished from the load chip 13. More specifically, the capacitance connection determination circuit 33 includes an AND gate 33a. Thus, the capacitance connection determination circuit 33 controls the switch SW1 in the on state in response to reception of an activation notification signal indicating an enable signal from the load chip 13 in a period in which the voltage detection circuit 22 switches the switch SWx to the on state.

The semiconductor device 3 according to the third embodiment includes the capacitance connection determination circuit 33, and, consequently, can connect a smoothing capacitor C1 to the load chip 13 and cause the load chip 13 to stably operate in response to that that the switch SWx has switched to the on state and then the load chip 13 has activated.

As described above, the semiconductor device 3 according to the third embodiment can shorten the time which the load chip 13 takes to activate by using a more simple circuit than the voltage detection circuit 23. Thus, the semiconductor device 3 according to the third embodiment can shorten the time which the load chip 13 takes to activate while reducing a chip area of the load chip.

Fourth Embodiment

Figure 10:
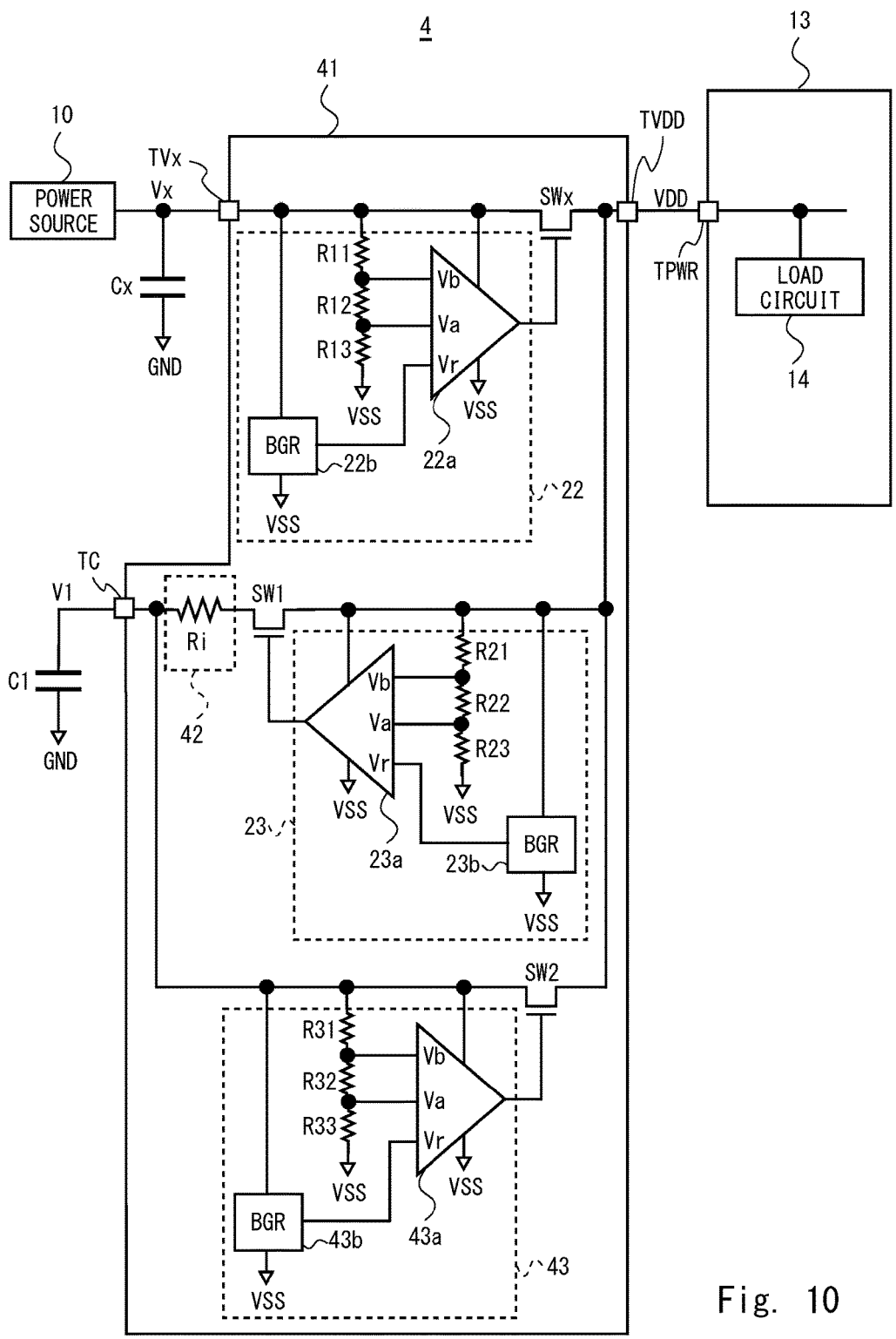
FIG. 10 is a block diagram of a semiconductor device according to a fourth embodiment.

Another mode of a semiconductor device 2 according to the second embodiment will be described in the fourth embodiment. FIG. 10 is a block diagram of a semiconductor device 4 according to the fourth embodiment. As illustrated in FIG. 10, the semiconductor device 4 according to the fourth embodiment includes a control chip 41 instead of a control chip 21.

The control chip 41 includes voltage detection circuits 22 and 23, and, in addition, a current limiting unit 42, a voltage detection circuit 43 and a third switch (e.g. a switch SW2). The current limiting unit 42 includes a current limiting resistor Ri. This current limiting resistor Ri is inserted in series to a switch SW1. In an example illustrated in FIG. 10, the current limiting resistor Ri is provided between the switch SW1 and a smoothing capacitance connection terminal TC.

The switch SW2 is connected in parallel to the switch SW1 and the current limiting resistor Ri. The voltage detection circuit 43 switches the switch SW2 from the off state to the on state in response to that a voltage V1 of the smoothing capacitance connection terminal TC has reached a certain voltage value. More specifically, the voltage detection circuit 43 controls the switch SW2 in the on state until a voltage of a first power supply voltage Vx reaches a fifth setting voltage Vth_SW2_ON and reaches a sixth setting voltage Vth_SW2_OFF lower than a first setting voltage Vth_SW4_ON. In this regard, the fifth setting voltage Vth_SW2_ON in the fourth embodiment is preferably a voltage slightly higher than a third setting voltage Vth_SW1_ON. Further, the sixth setting voltage Vth_SW2_ON in the fourth embodiment is preferably a voltage slightly higher than a fourth setting voltage Vth_SW1_OFF.

The voltage detection circuit 43 includes a comparator 43a, a constant voltage source 43b and resistors R31 to R33. The comparator 43a and the constant voltage source 43b operate based on the voltage V1. The constant voltage source 43b outputs a reference voltage Vr. The resistors R31 to R33 are connected in series between a ground terminal and a wiring which receives a supply of the voltage V1. Further, the resistors R31 to T33 output voltages Va and Vb obtained by dividing the voltage V1 from a node which connects the resistor and the resistor. The voltage Va is a voltage which reaches the reference voltage Vr at a point of time at which the voltage V1 has reached the fifth setting voltage Vth_SW2_ON. The voltage Vb is a voltage which reaches the reference voltage Vr at a point of time at which the voltage V1 has reached the sixth setting voltage Vth_SW2_OFF. The comparator 43a switches the switch SW2 from an off state to an on state in response to that the voltage Va has exceeded the reference voltage Vr. Further, after switching the switch SW2 to the on state, the comparator 43a switches the switch SW2 from the on state to the off state in response to that the voltage Vb has gone below the reference voltage Vr. That is, the comparator 43a functions as a hysteresis comparator having two different thresholds with respect to the voltage V1.

Figure 11:
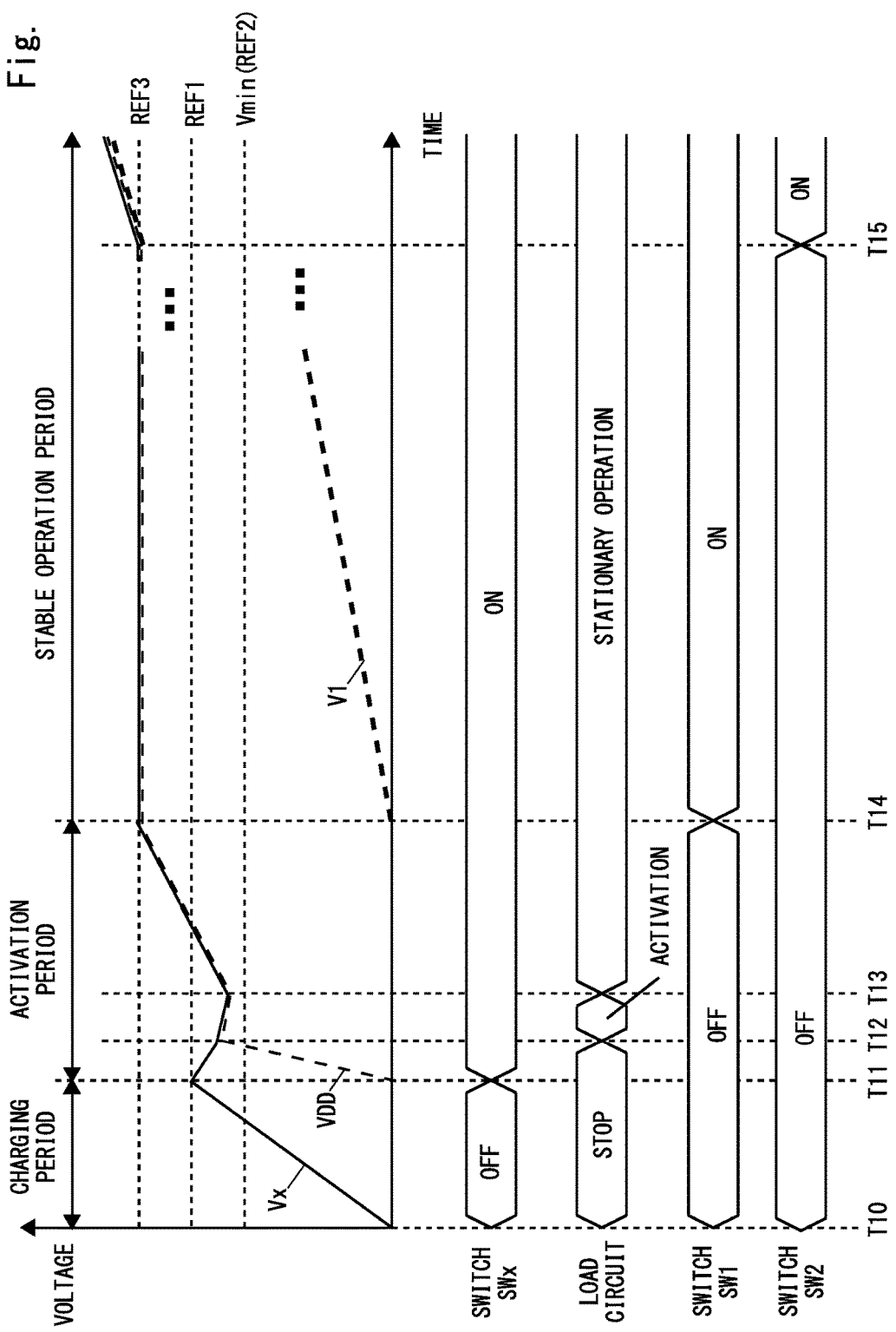
FIG. 11 is a timing chart for explaining an operation of the semiconductor device according to the fourth embodiment.

Next, an operation of the semiconductor device 4 according to the fourth embodiment will be described. FIG. 11 is a timing chart for explaining the operation of the semiconductor device 4 according to the fourth embodiment. As illustrated in FIG. 11, in the semiconductor device 4 according to the fourth embodiment, processing performed until activation of a load chip 13 is finished at a timing T14 and the semiconductor device 4 enters the stable operation period is the same as an operation of a semiconductor device 2 according to the second embodiment illustrated in FIG. 8 performed until a timing T4.

Further, at a timing T13 or after, the on state of the switch SW1 is maintained in the fourth embodiment. This is because the current limiting resistor Ri limits a current flowing in a smoothing capacitor C1, and therefore a second power supply voltage VDD does not lower to the fourth setting voltage Vth_SW1_OFF. Further, in the semiconductor device 4 according to the fourth embodiment, the voltage V1 continuously rises. Further, when the voltage V1 reaches the fifth setting voltage Vth_SW2_ON corresponding to a setting voltage REF3 at a timing T15, the switch SW2 is switched to the on state.

As described above, in the semiconductor device 4 according to the fourth embodiment, the current limiting resistor Ri limits the current flowing in the smoothing capacitor C1 until the voltage V1 produced in the smoothing capacitor C1 reaches a voltage close to the second power supply voltage VDD. Thus, the semiconductor device 4 according to the fourth embodiment can continue an operation of charging the smoothing capacitor C1 while suppressing a fluctuation of the second power supply voltage VDD.

Further, the semiconductor device 4 according to the fourth embodiment switches the switch SW2 from the off state to the on state after the voltage V1 reaches a voltage close to the second power supply voltage VDD. Thus, the semiconductor device 4 according to the fourth embodiment can connect the load chip 13 and the smoothing capacitor C1 such that the sufficiently charged smoothing capacitor C1 is not influenced by the current limiting resistor Ri. Consequently, the semiconductor device 4 according to the fourth embodiment can lower a resistance value of a path which connects the load chip 13 and the smoothing capacitor C1 after sufficiently charging the smoothing capacitor C1, and enhance an effect of suppressing a fluctuation of the second power supply voltage VDD by the smoothing capacitor C1.

Fifth Embodiment

Figure 12:
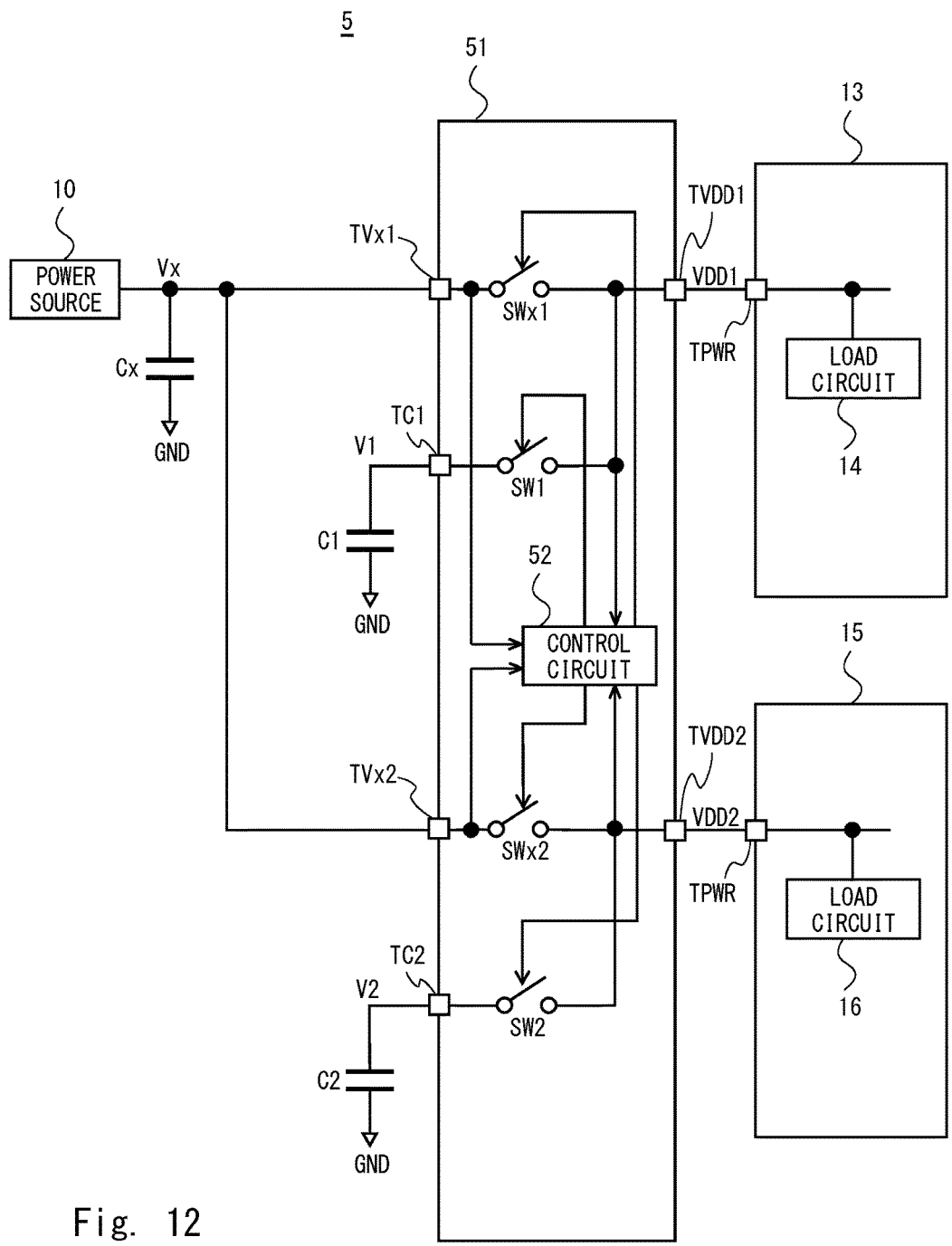
FIG. 12 is a block diagram of a semiconductor device according to a fifth embodiment.

Another mode of a semiconductor device 1 according to the first embodiment will be described in the fifth embodiment. FIG. 12 is a block diagram of a semiconductor device 5 according to the fifth embodiment. As illustrated in FIG. 12, the semiconductor device 5 supplies necessary power for an operation from a power source 10 to a first load chip (e.g. a load chip 13) and a second load chip (e.g. a load chip 15). In addition, the load chip 15 includes a load circuit 16.

The semiconductor device 5 according to the fifth embodiment includes a control chip 51 instead of a control chip 11. The control chip 51 includes a first switch (e.g. a switch SWx1), a second switch (e.g. a switch SW1), a third switch (e.g. a switch SWx2) and a fourth switch (e.g. a switch SW2). Further, the control chip 51 includes a control circuit 52 instead of a control circuit 12. Furthermore, the control chip 51 is configured by adding a fourth terminal (e.g. an input terminal TVx2), a fifth terminal (e.g. an output terminal TVDD2) and a sixth terminal (e.g. a smoothing capacitance connection terminal TC2) to the control chip 11. In addition, FIG. 12 illustrates an input terminal TVx as TVx1, an output terminal TVDD as TVDD1, and a smoothing capacitance connection terminal TC as TC1.

The switches SWx1 and SW1 are the same as the switches SWx and SW1 of the semiconductor device 1 according to the first embodiment. The switch SWx2 is provided between the input terminal TVx2 and the output terminal TVDD2. The switch SW2 is provided between the output terminal TVDD2 and the smoothing capacitance connection terminal TC2. In addition, the input terminal TVx2 is connected with one end of a charging capacitor Cx. The output terminal TVDD2 is connected with one end of a power supply wiring which supplies a third power supply voltage VDD2 to the load chip 15. The smoothing capacitance connection terminal TC2 is connected with one end of a second smoothing capacitor (e.g. a smoothing capacitor C2) which suppresses a fluctuation of the third power supply voltage VDD2.

The control circuit 52 controls the switches SWx1 and SW1 similar to the control circuit 12 according to the first embodiment. Further, after switching the switch SWx2 from the off state to the on state, the control circuit 52 switches the switch SW2 from the off state to the on state in response to that the third power supply voltage VDD2 has satisfied certain conditions. Control performed on the switches SWx2 and SW2 of the control circuit 52 is the same as control performed on the switches SWx1 and SW1.

Figure 13:
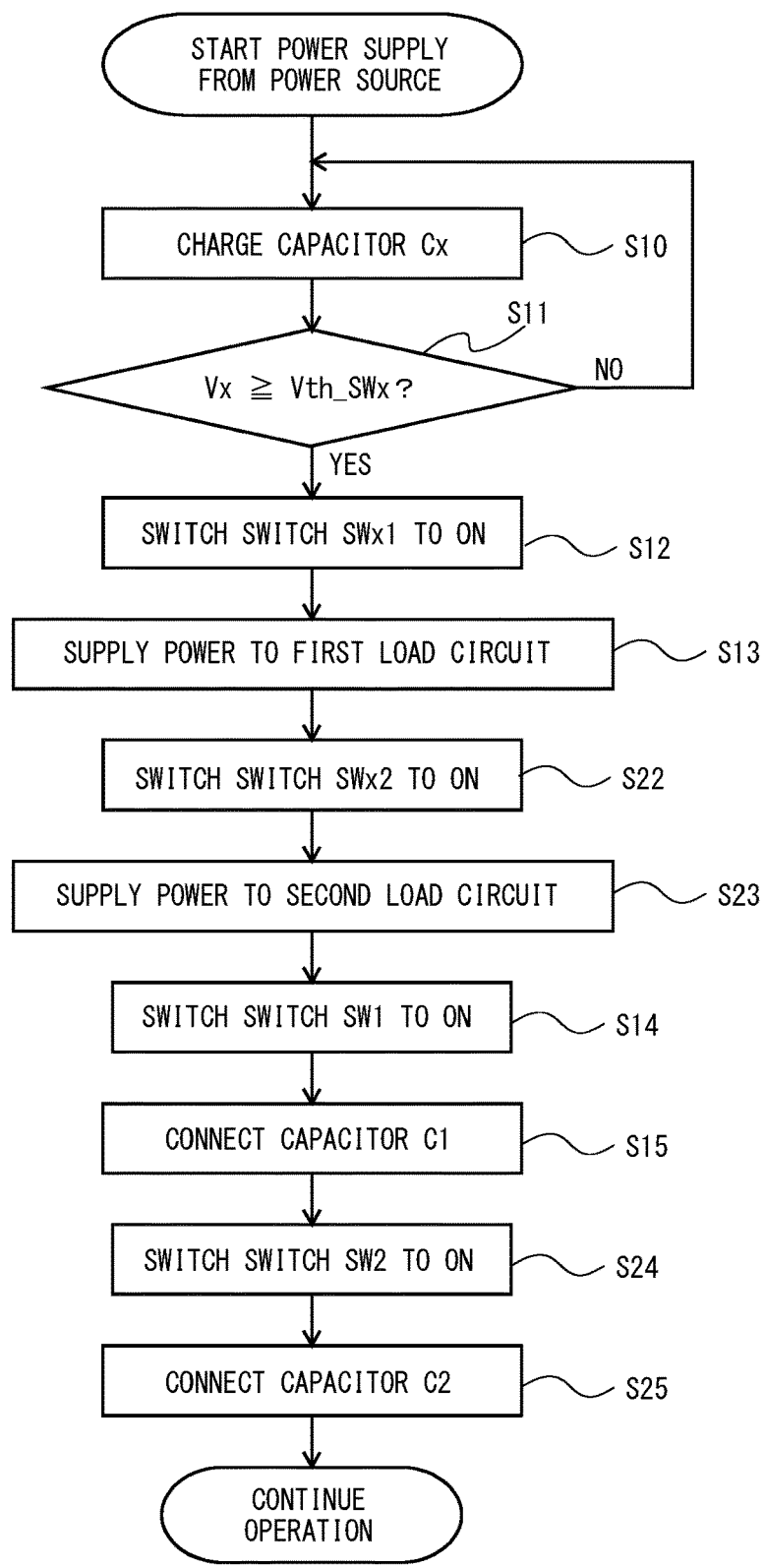
FIG. 13 is a flowchart for explaining an operation of the semiconductor device according to the fifth embodiment.

Next, an operation of the semiconductor device 5 according to the fifth embodiment will be described. FIG. 13 is a flowchart for explaining the operation of the semiconductor device 5 according to the fifth embodiment. As illustrated in FIG. 13, the operation of the semiconductor device 5 according to the fifth embodiment is an operation including processing of steps S22 and S23 between step S13 and S14 of the operation of the semiconductor device 1 according to the first embodiment. That is, the semiconductor device 5 according to the fifth embodiment supplies power to the load chip 15 by switching the switch SWx2 to the on state after switching the switch SWx1 to the on state. Further, the operation of the semiconductor device 5 according to the fifth embodiment is an operation including processing of steps S24 and S25 at a subsequent stage of step S15 of the operation of the semiconductor device 1 according to the first embodiment. That is, the semiconductor device 5 according to the fifth embodiment supplies power to the smoothing capacitor C2 by switching the switch SW2 to the on state after switching the switch SW1 to the on state.

In addition, the switches SWx1 and SWx2 may be simultaneously switched to the on states, and the switches SW1 and SW2 may be simultaneously switched to the on states. Further, the switch SWx2 may be switched to the on state earlier than the switch SWx1, and the switch SW2 may be switched to the on state earlier than the switch SW1. A switch control order is preferably determined based on the magnitude of activation power of a load chip or a system response speed. For example, activating the load chip of higher activation power earlier causes the system to stably operate. Further, when a request to activate one load chip earlier is greater, the load chip needs to be activated earlier.

As described above, the control chip 51 includes a combination of switches corresponding to the number of load chips, so that the semiconductor device 5 according to the fifth embodiment supplies power to a plurality of load chips. In this case, by using the control chip 51, the smoothing capacitors C1 and C2 are connected after the load chip is activated. Consequently, the semiconductor device 5 according to the fifth embodiment can shorten a time which the load chip takes to activate.

Sixth Embodiment

Figure 14:
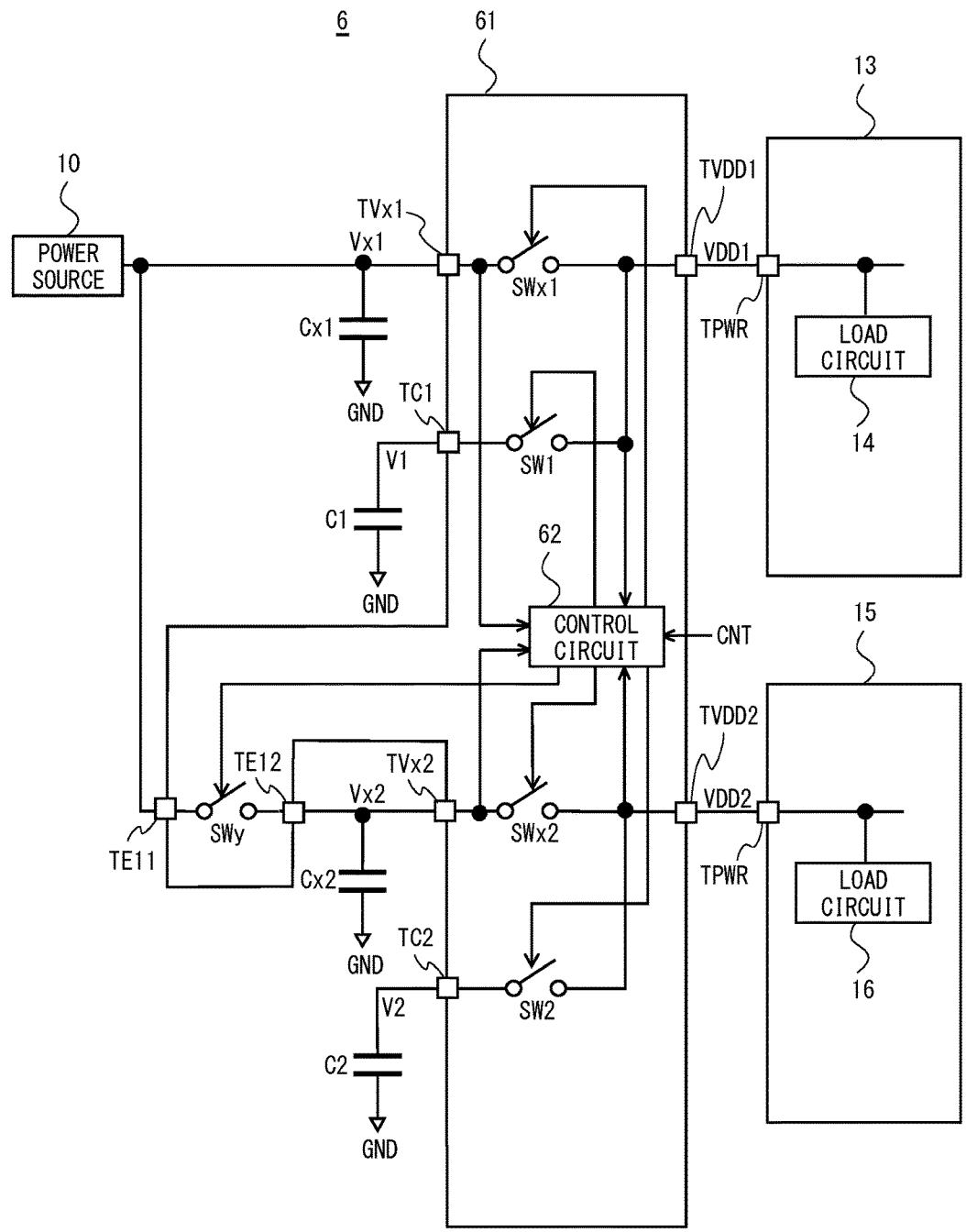
FIG. 14 is a block diagram of a semiconductor device according to a sixth embodiment.

A modified example of a semiconductor device 5 according to the fifth embodiment will be described in the sixth embodiment. FIG. 14 is a block diagram of a semiconductor device 6 according to the sixth embodiment. As illustrated in FIG. 14, the semiconductor device 6 according to the sixth embodiment includes a control chip 61 configured by adding a fifth switch (e.g. a switch SWy) to a control chip 51. Further, the control chip 61 is provided with a control circuit 62 instead of a control circuit 52. The control circuit 62 has a function configured by adding to the function of the control chip 51 a function of switching the switch SWy from the off state to the on state in response to an activation request CNT for activating a load chip 15.

Further, the semiconductor device 6 according to the sixth embodiment includes a first charging capacitor (e.g. a charging capacitor Cx) and, in addition, a second charging capacitor (e.g. a charging capacitor Cx2). Hence, the control chip 61 is configured by adding a seventh terminal (e.g. a connection terminal TE12) and an eighth terminal (e.g. a connection terminal TE11) to the control chip 51. The connection terminal TE12 is connected to one end of the charging capacitor Cx2 whose one end is connected to an input terminal TVx2. The connection terminal TE11 is connected to a power source 10. Further, in the control chip 61, the switch SWy is provided between the connection terminal TE11 and the connection terminal TE12.

According to the above configuration, a charging capacitor is individually provided per load chip in the semiconductor device 6 according to the sixth embodiment. Consequently, the semiconductor device 6 according to the sixth embodiment can individually activate the load chip 15 and activate the load chip 13. When, for example, a charging capacitor is shared by two load chips in a state where the load chip of high activation power and a load chip of low activation power are combined, the charging capacitor cannot be shared if the charging capacitor of a higher capacitance is adopted to make up for activation power. However, in this case, a start-up time of a load chip which is activated by a low capacitance becomes longer. However, by providing a charging capacitor per load chip, the charging capacitor can set a low capacitance value of the charging capacitor corresponding to the load chip, and shorten the time which the load chip of this low activation power takes to activate. By so doing, for example, it is possible to activate the load chip of low activation power at a high speed, place an entire system in an operable state, then activate a load chip of high activation power and enable use of an additional functional.

Figure 15:
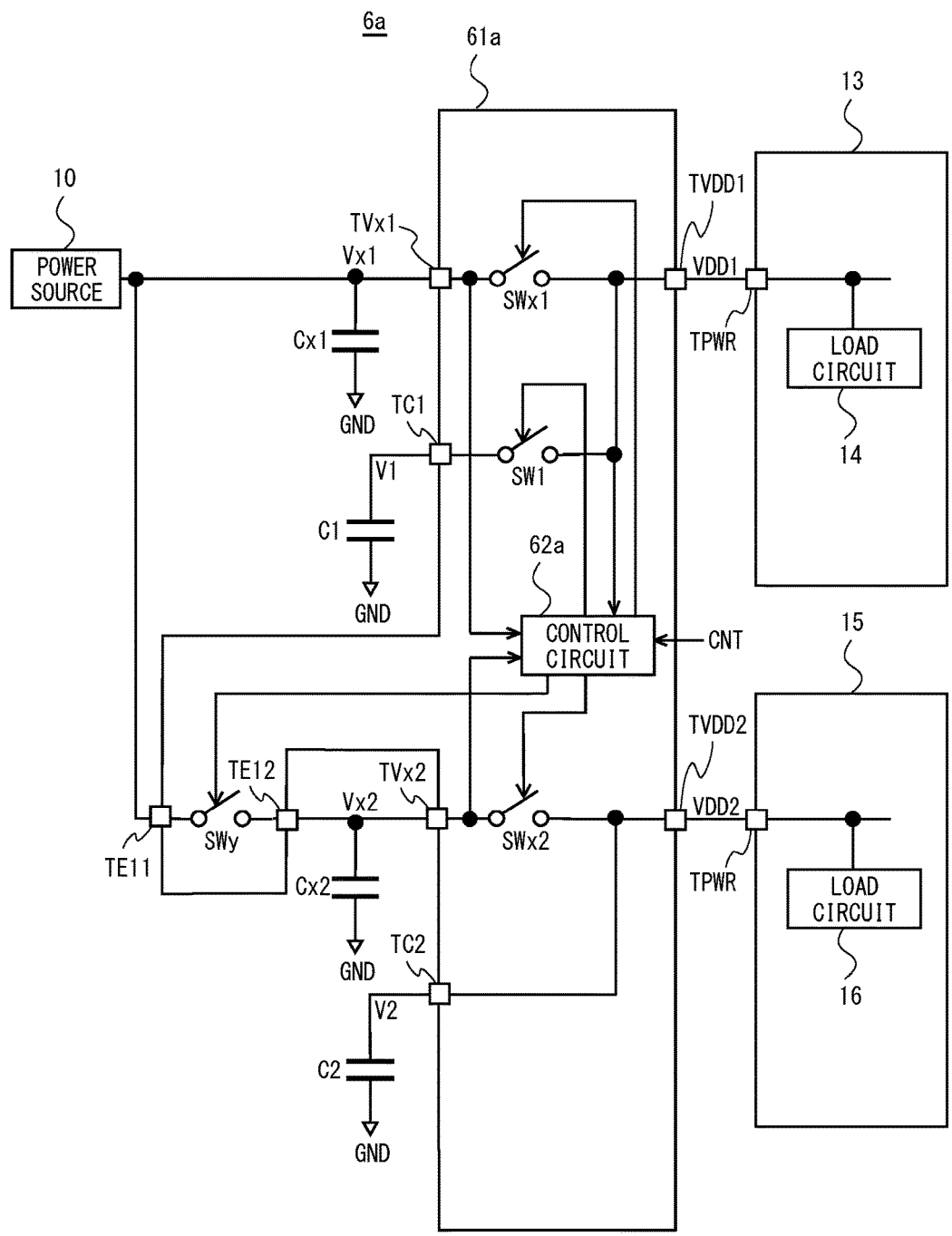
FIG. 15 is a block diagram of a modified example of the semiconductor device according to the sixth embodiment.

In addition, the semiconductor device 6 according to the sixth embodiment can also skip the switch SW2. FIG. 15 is a block diagram of a semiconductor device 6a in which the switch SW2 is removed from the control chip 61 according to the sixth embodiment. In addition, in FIG. 15, a reference numeral of the control chip 61 from which the switch SW2 is removed is 61a. Further, in FIG. 15, a reference numeral of the control circuit 62 from which a function of controlling the switch SW is removed is 62a. As described in the previous paragraph, when there is not much a request for high-speed activation of the load chip 15 corresponding to the charging capacitor Cx2, it is also possible to remove the switch SW2 and reduce a circuit area of the control chip.

Seventh Embodiment

Figure 16:
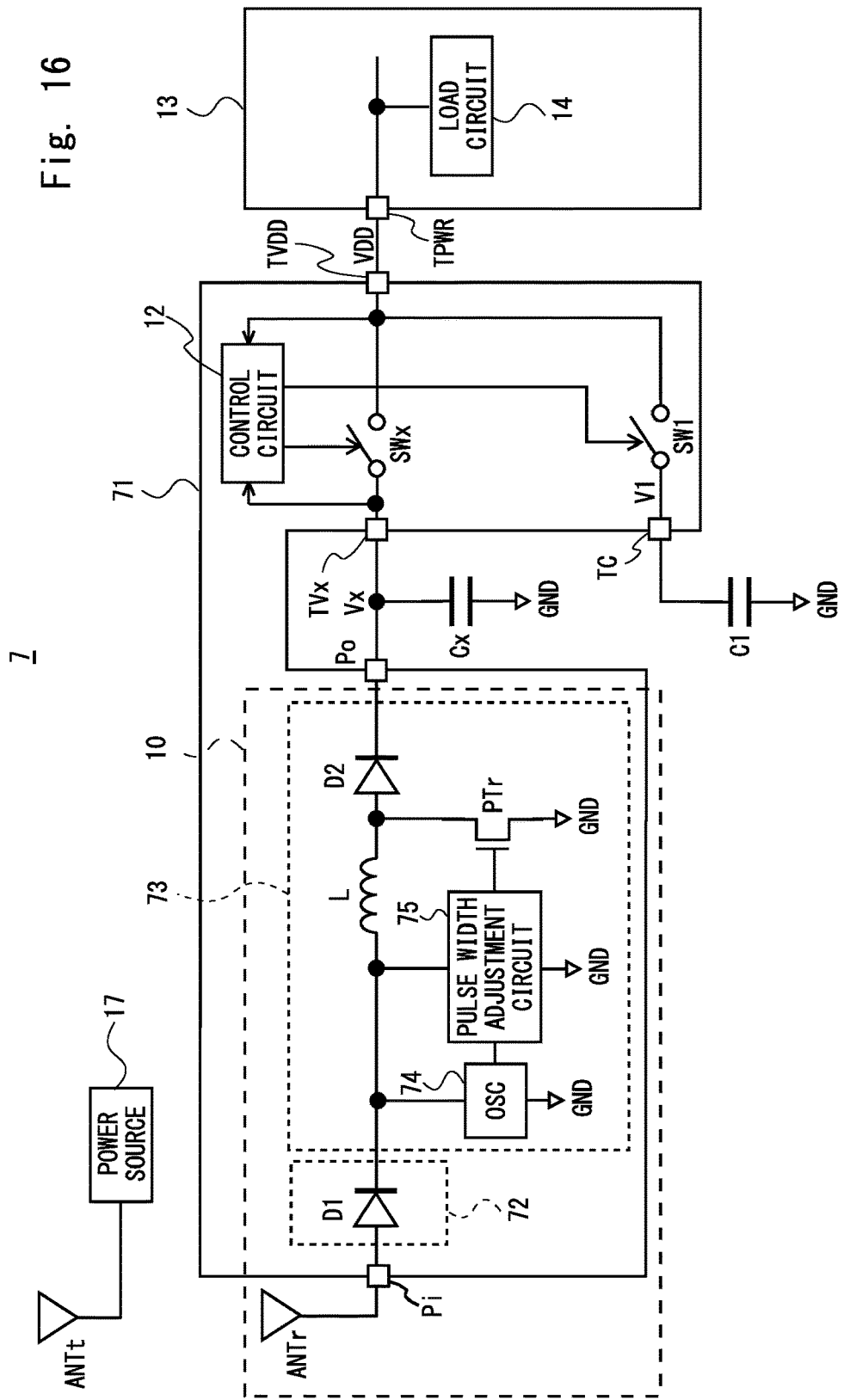
FIG. 16 is a block diagram of a semiconductor device according to a seventh embodiment.

One aspect of a power source 10 of a semiconductor device 1 according to the first embodiment will be more specifically described in the seventh embodiment. FIG. 16 is a block diagram of a semiconductor device 7 according to the seventh embodiment. In an example illustrated in FIG. 16, the power source 10 includes a non-contact coupling unit (e.g. an antenna ANTr), a rectifying unit 72 and an amplifier circuit (e.g. a step-up circuit 73). FIG. 16 illustrates the antenna ANTr as the non-contact coupling unit. A coil or the like which transmits power byway of magnetic coupling or electromagnetic induction can be used as a non-contact coupling unit. Further, in the example illustrated in FIG. 16, the rectifying unit 72 and the step-up circuit 73 are formed on the same semiconductor chip as that of switches SWx and SW1. Hence, a control chip 71 configured by adding the rectifying unit 72 and the step-up circuit 73 to a control chip 11 is provided.

Further, as illustrated in FIG. 16, the control chip 71 according to the seventh embodiment includes a fourth terminal (e.g. a terminal Po) and a fifth terminal (e.g. a terminal Pi) at both ends of a power circuit configured by the rectifying unit 72 and the step-up circuit 73. The terminal Po is connected with one end of a charging capacitor Cx. The terminal Pi is connected with one end of the non-contact coupling unit which receives a power signal outputted from another device (e.g. a power source 17).

The antenna ANTr receives a radio signal from an antenna ANTt, and outputs the power signal to a subsequent circuit. The antenna ANTt is driven by a power source 17 provided to another device. The rectifying unit 72 rectifies the power signal inputted from the antenna ANTr, and transmits the power signal to the subsequent circuit. The step-up circuit 73 amplifies a signal rectified by the rectifying unit 72, and generates a first power supply voltage Vx. When the charging capacitor Cx is charged by the current outputted from this step-up circuit 73, the first power supply voltage Vx is generated.

In the seventh embodiment, a diode D1 is used for the rectifying unit 72. The diode D1 includes an anode connected to the terminal Pi, and a cathode connected to the step-up circuit 73. This diode D1 functions as a half-wave rectifier circuit.

The step-up circuit 73 is connected in series to the rectifying unit, and amplifies the power signal and generates the first power supply voltage Vx. The step-up circuit 73 includes an oscillator 74, a pulse width adjustment circuit 75, an inductor L, a diode D2 and a power transistor PTr. The oscillator 74 and the pulse width adjustment circuit 75 operate based on the voltage of the signal obtained through the rectifying unit 72. The oscillator 74 outputs a clock signal for determining the frequency of a PWM signal outputted from the pulse width adjustment circuit 75. The pulse width adjustment circuit 75 adjusts the pulse width of the clock signal outputted from the oscillator 74, according to a voltage value of the first power supply voltage Vx, and outputs the PWM signal. The inductor L and the diode D2 are connected in series between a diode D1 and the terminal Po. The power transistor PTr is a NMOS transistor. This power transistor PTr is connected between a ground terminal and a node between the inductor L and the diode D2. Further, the power transistor PTr repeats on and off according to the PWM signal outputted from the pulse width adjustment circuit 75.

In the semiconductor device 7 according to the seventh embodiment, the power source 10 includes the step-up circuit 73, so that it is possible to make the voltage value of the first power supply voltage Vx higher than a voltage value of a direct current value obtained only by smoothing a power signal. Consequently, the semiconductor device 7 according to the seventh embodiment can reduce a capacitance value of the charging capacitor Cx.

Eighth Embodiment

Figure 17:
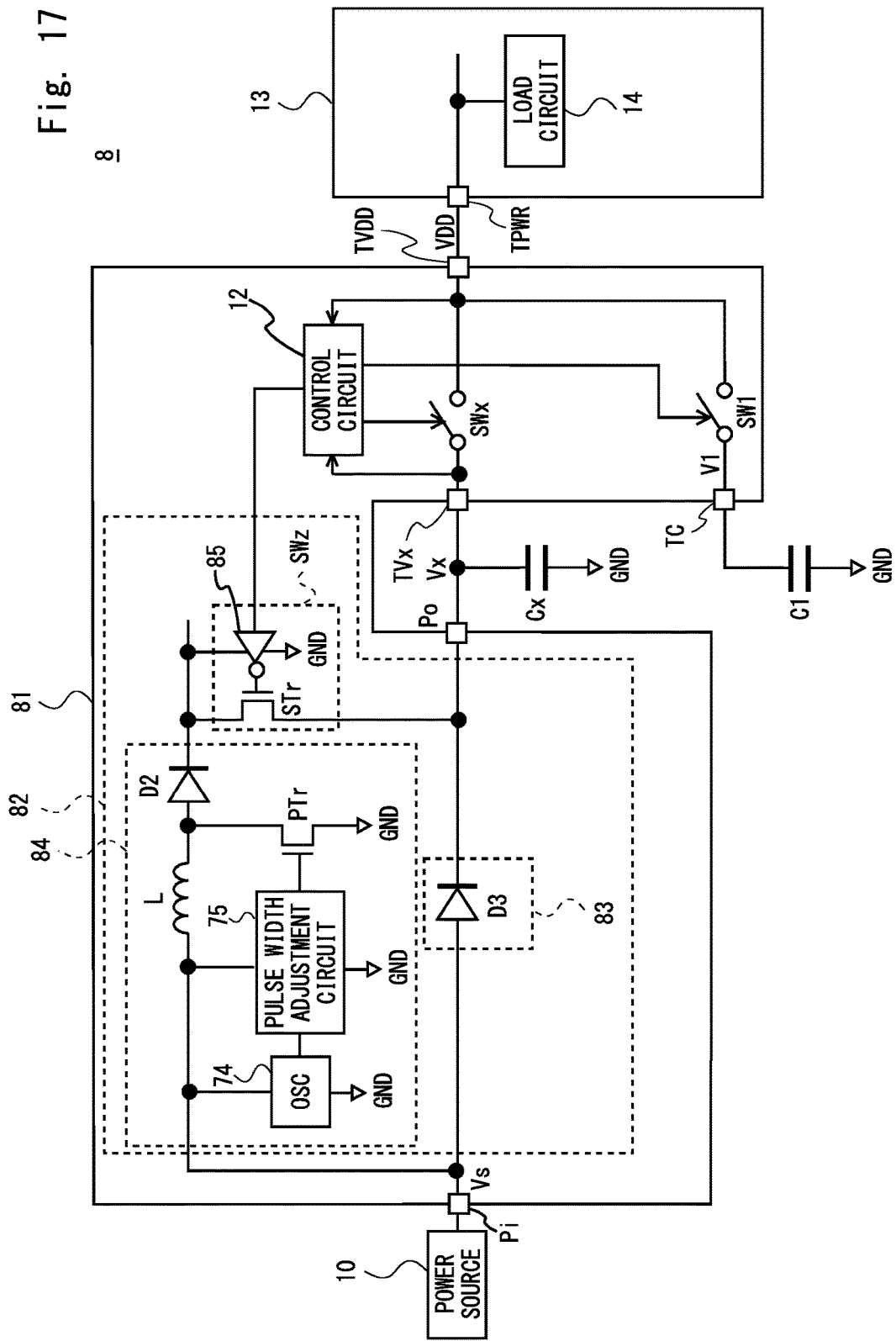
FIG. 17 is a block diagram of a semiconductor device according to an eighth embodiment.

Another mode of a semiconductor device 1 according to the first embodiment will be described in the eighth embodiment. FIG. 17 is a block diagram of a semiconductor device 8 according to the eighth embodiment. As illustrated in FIG. 17, the semiconductor device 8 according to the eighth embodiment uses a control chip 81 configured by adding a power circuit 82 to a control chip 11. The control chip 81 includes a fourth terminal (e.g. a terminal Po) and a fifth terminal (e.g. a terminal Pi).

The power circuit 82 is connected between the terminal Pi and the terminal Po. The power circuit 82 includes a reverse flow prevention circuit 83, an amplifier circuit (e.g. a step-up circuit 84) and a third switch (e.g. a switch SWz). The step-up circuit 84 steps up power outputted from the power source, and generates a first power supply voltage Vx. In an example illustrated in FIG. 17, a power source 10 outputs power whose voltage is Vs, and the step-up circuit 84 steps up the first power supply voltage Vx until the voltage reaches the voltage Vs or more. In this regard, the step-up circuit 84 employs the same configuration as that of the step-up circuit 73 described in the seventh embodiment, and therefore will not be described.

The reverse flow prevention circuit 83 is connected in parallel to the step-up circuit 84. The reverse flow prevention circuit 83 prevents a reverse flow of the stepped-up first power supply voltage Vx to the power source 10. The reverse flow prevention circuit 83 includes a diode D3. The diode D3 includes an anode connected to the terminal Pi, and a cathode connected to the terminal Po.

The switch SWz is provided between the output of the step-up circuit 84 and the terminal Po. Further, the switch SWz includes a switch transistor STr which is a transistor of the same conduction type as that of a switch SWx, and an inverter 85. Furthermore, in the seventh embodiment, a control circuit 12 performs control to exclusively switch the switches SWz and the switch SWx to on states. More specifically, the control circuit 12 according to the seventh embodiment switches the switch SWz to the on state in a period in which the first power supply voltage Vx reaches a step-up voltage set in advance.

Figure 18:
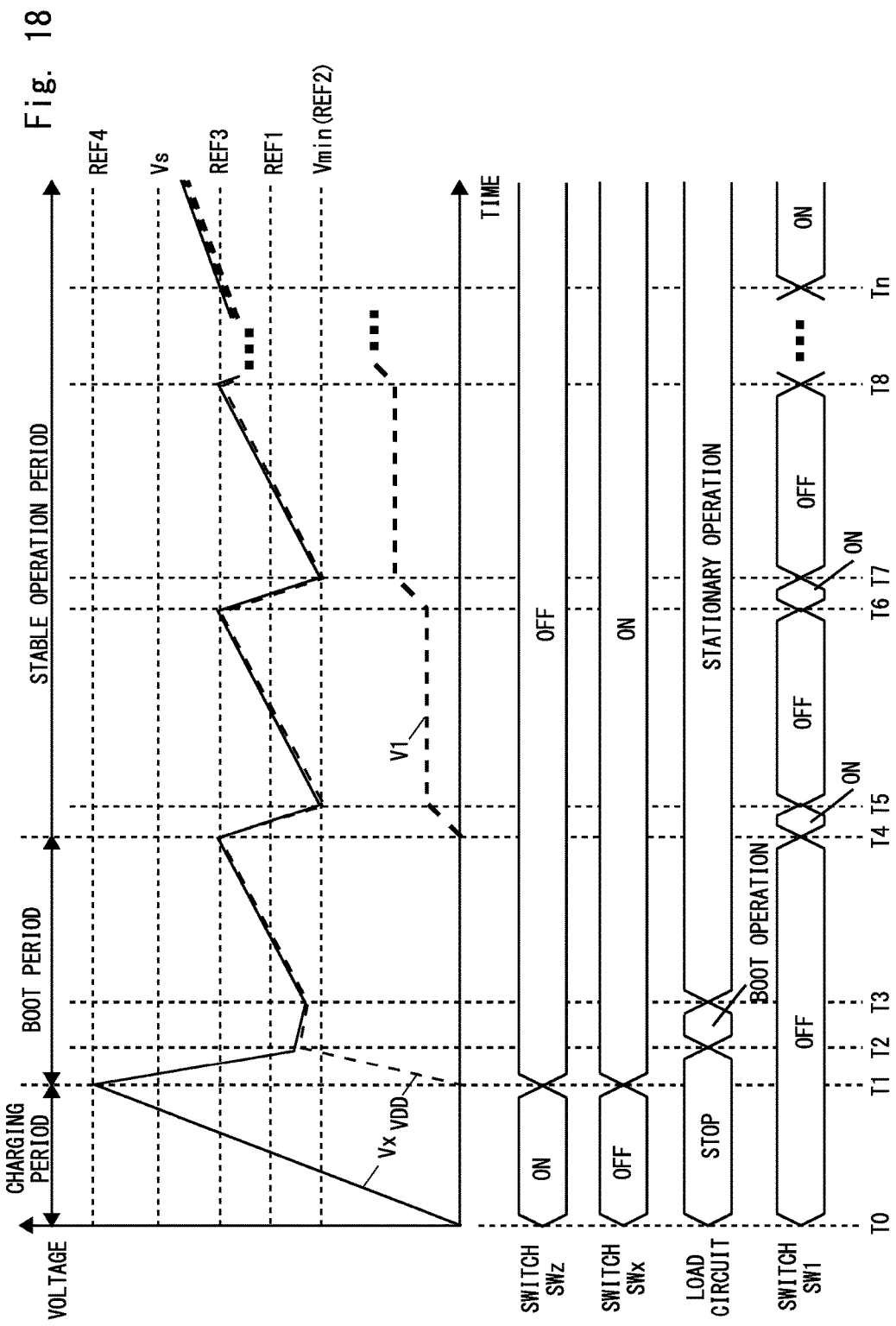
FIG. 18 is a timing chart for explaining an operation of the semiconductor device according to the eighth embodiment.

Next, an operation of the semiconductor device 8 according to the eighth embodiment will be described. FIG. 18 is a timing chart for explaining the operation of the semiconductor device 8 according to the eighth embodiment. As illustrated in FIG. 18, the semiconductor device 8 according to the eighth embodiment steps up the first power supply voltage Vx until the first power supply voltage Vx reaches a setting voltage REF4 (e.g. a third setting voltage Vth_SWz_OFF) higher than the voltage Vs outputted from the power source 10 in a charging period from a timing T20 to a timing T21.

Further, in response to that the first power supply voltage Vx has reached the third setting voltage value Vth_SWz_OFF at the timing T21, the switch SWz is switched from the on state to the off state, and the switch SWx is switched from the off state to the on state. An operation of transitioning to the timing T21 is the same as that in the semiconductor device 2 according to the second embodiment described with reference to FIG. 8.

As described above, after stepping up the first power supply voltage Vx to a voltage higher than the voltage outputted from the power source 10, the semiconductor device 8 according to the eighth embodiment causes the switch SWx to transition to the on state and activates a load chip 13. Thus, the semiconductor device 8 according to the eighth embodiment can reduce a capacitance of a charging capacitor Cx. Further, by reducing the capacitance of the charging capacitor Cx, it is possible to shorten the duration of the charging period, and shorten a time which the load chip 13 takes to activate.

A stepping-up effect of the step-up circuit 84 will be described as a specific example by using equation (4). Comparison is made between a case where the first power supply voltage Vx is stepped up to 6 V, and the first power supply voltage Vx is stepped up to 3 V when energy required to activate the load chip 13 is 10 µJ and a minimum operation voltage of the load chip 13 is 2 V. In this case, in case where the first power supply voltage Vx is stepped up to 6 V, the capacitance of the charging capacitor Cs is 0.625 µF. Meanwhile, in case where the first power supply voltage Vx is stepped up only to 3 V, the capacitance of the charging capacitor Cx is 4 µF.

Further, when energy to be charged for activation is calculated by using equation (6) and equation (7), the energy to be charged for activation in case where the first power supply voltage Vx is stepped up to 6 V is 11.25 µJ, and the energy to be charged for activation in case where the first power supply voltage Vx is stepped up only to 3 V is 18 µJ. Consequently, it is possible to reduce energy to be charged for activation by 37% by stepping up the first power supply voltage.

Further, the semiconductor device 8 according to the eighth embodiment isolates the step-up circuit 84 from the terminal Po after the charging time passes. Consequently, the semiconductor device 8 according to the eighth embodiment can reduce power consumption of the step-up circuit 84 after the charging period passes.

Figure 19:
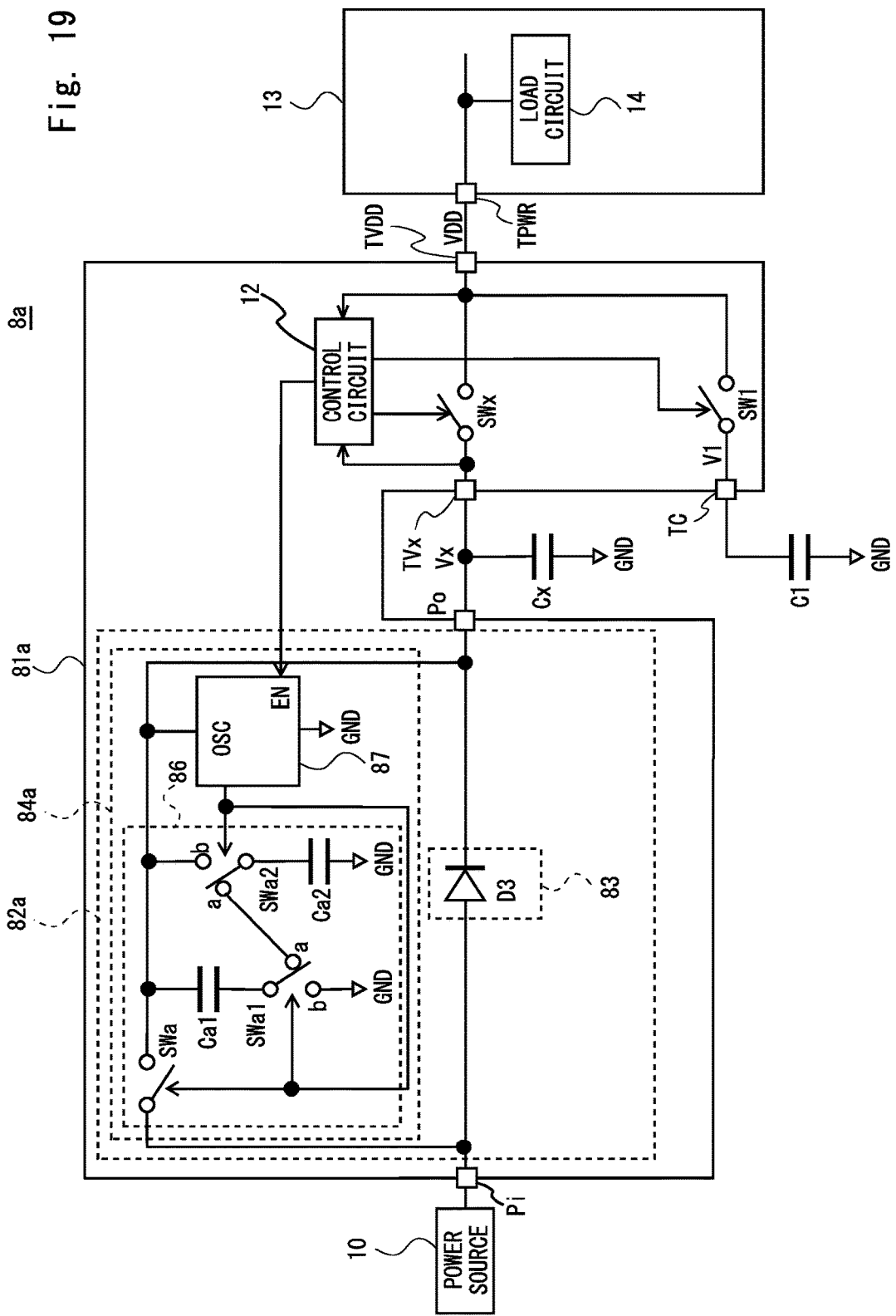
FIG. 19 is a block diagram of a modified example of the semiconductor device according to the eighth embodiment.

In addition, the step-up circuit 84 can also use another circuit. Next, a semiconductor device 8a which is a modified example of the semiconductor device 8 according to the eighth embodiment will be described. FIG. 19 is a block diagram of the semiconductor device 8a according to the eighth embodiment. As illustrated in FIG. 19, the semiconductor device 8a includes a power circuit 82a which uses a switched capacitor circuit 84a instead of a step-up circuit 84. In addition, a reference numeral of a control chip 81 including the power circuit 82a is 81a.

The switched capacitor circuit 84a amplifies power outputted from the power source 10, and generates the first power supply voltage Vx. The switched capacitor circuit 84a includes a step-up unit 86 and an oscillator 87. The step-up unit 86 performs a step-up operation using capacitors Ca1 and Ca2 by controlling switches SWa, SWa1 and SWa2 according to a clock signal outputted from the oscillator 87. Further, the oscillator 87 receives an input of a control signal from the control circuit 12, and generates a clock signal in a period in which the switch SWx is in the off state.

Thus, various circuits can be used for the step-up circuit 84. In addition, the switched capacitor circuit consumes low power and can start operation at a low operating voltage, and, consequently, is very effective when the power source 10 is a micropower source.

Ninth Embodiment

Figure 20:
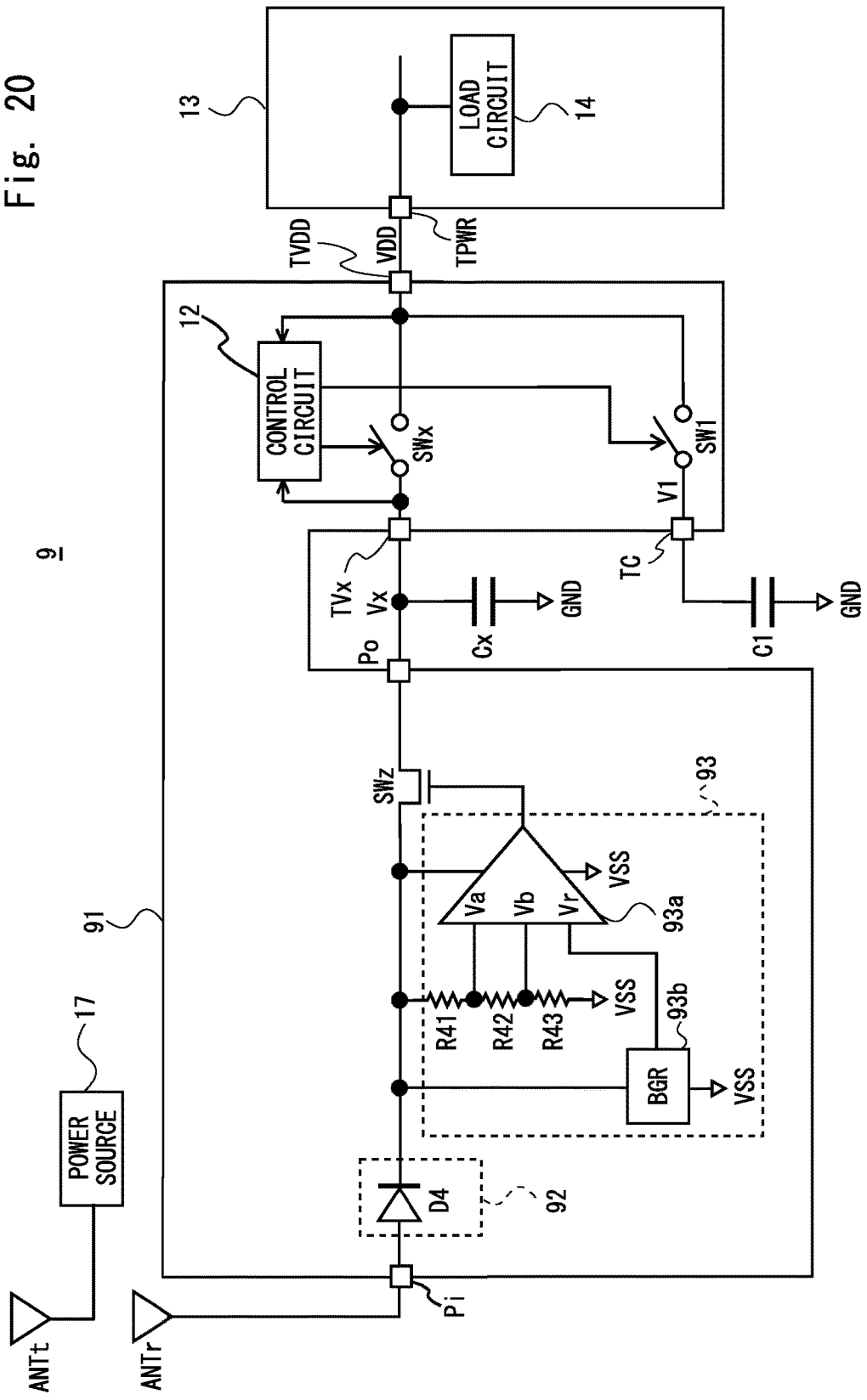
FIG. 20 is a block diagram of a semiconductor device according to a ninth embodiment.

A semiconductor device 9 which is another mode of a semiconductor device 7 according to the seventh embodiment will be described in the ninth embodiment. FIG. 20 is a block diagram of the semiconductor device 9 according to the ninth embodiment.

As illustrated in FIG. 9, in the ninth embodiment, a control chip 91 configured by adding a rectifying unit 92, a voltage detection circuit 93 and a third switch (e.g. a switch SWz) to a control chip 11 is provided. A fourth terminal (e.g. a terminal Po) and a fifth terminal (e.g. a terminal Pi) are added to this control chip 91.

The terminal Po is connected with one end of a charging capacitor Cx. The terminal Pi is connected with one end of a non-contact coupling unit (e.g. an antenna ANTr) which receives a power signal outputted from another device. The rectifying unit 92 performs full-wave rectification on the power signal received through the antenna ANTr. The switch SWz is provided between the terminal Po and the fifth terminal Pi. More specifically, the switch SWz is connected to a subsequent stage of the rectifying unit 92. The voltage detection circuit 93 monitors an input voltage of a wiring which connects the switch SWz and the rectifying unit 92, and switches the switch SWz from the off state to the on state in response to that the input voltage has reached a certain voltage.

According to this configuration, the semiconductor device 9 according to the ninth embodiment can stop charging the charging capacitor Cx when the antenna ANTr is used for communication or the like. More specifically, when the antenna ANTr is used for communication or when power obtained from the antenna ANTr is used to charge the charging capacitor Cs, a failure that the strength of signals used for communication lowers occurs. However, by using the semiconductor device 9 according to the ninth embodiment, it is possible to switch the switch SWx to the off state and enhance a signal strength of a communication signal when the voltage detection circuit 93 detects a decrease in the voltage due to a decrease in power from the antenna ANTr.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to ninth embodiments can be combined as desirable by one of ordinary skill in the art.

For example, the semiconductor device according to the above embodiment may employ a configuration where conduction types (the p type or an n type) of a semiconductor substrate, a semiconductor layer, a diffusion layer (diffusion region) and the like are inverted. Hence, when the conduction type of one of the n type and the p type is a first conduction type, and the other conduction type is a second condition type, the first conduction type can be set to the p type and the second conduction type can be set to the n type, and the first conduction type can be set to the n type and the second condition type can be set to the p type.

What is claimed is:

1. A semiconductor device comprising:
    a first terminal is connected with one end of a charging capacitor that generates a first power supply voltage;
    a second terminal that is connected with one end of a power supply wiring that supplies a second power supply voltage to a first circuit;
    a third terminal that is connected with one end of a smoothing capacitor that suppresses a fluctuation of the second power supply voltage;
    a first switch that is provided between the first terminal and the second terminal;
    a second switch that is provided between the second terminal and the third terminal; and
    a control circuit that controls an on/off state of the first switch and the second switch,
    wherein, after switching the first switch from the off state to the on state, the control circuit switches the second switch from the off state to the on state according to a voltage level of the second power supply voltage, and
    wherein the control circuit switches the first switch from the off state to the on state in response to that the first power supply voltage has reached a first setting voltage, and maintains the first switch in the on state in response to the first power supply voltage being between the first setting voltage and a second setting voltage lower than the first setting voltage.

2. The semiconductor device according to claim 1, wherein the control circuit switches the second switch from the off state to the on state in response to that the second power supply voltage has reached a third setting voltage, and maintains the second switch in the on state in response to the second power supply voltage being between the third setting voltage and a fourth setting voltage lower than the third setting voltage.

3. The semiconductor device according to claim 2, wherein
    the third setting voltage is higher than the first setting voltage, and
    the fourth setting voltage is higher than the second setting voltage and is lower than the first setting voltage.

4. The semiconductor device according to claim 1, wherein
    the control circuit includes a first voltage detection circuit and a second voltage detection circuit,
    the first voltage detection circuit controls the first switch in the on state until a voltage of the first power supply voltage reaches a first setting voltage and then reaches a second setting voltage lower than the first setting voltage, and
    the second voltage detection circuit controls the second switch in the on state until a voltage of the second power supply voltage reaches a third setting voltage, and then reaches a fourth setting voltage lower than the third setting voltage.

5. The semiconductor device according to claim 1, wherein
    the control circuit includes a voltage detection circuit and a capacitance connection determination circuit,
    the voltage detection circuit controls the first switch in the on state until a voltage of the first power supply voltage reaches a first setting voltage, and reaches a second setting voltage lower than the first setting voltage, and
    the capacitance connection determination circuit controls the second switch in the on state in response to that the voltage detection circuit has switched the switch to the on state and in response to reception of an activation notification signal for notifying that activation has been finished from the first circuit.

6. The semiconductor device according to claim 1, further comprising:
    a current limiting resistor that is inserted in series to the second switch; and
    a third switch that is connected in parallel to the second switch and the current limiting resistor,
    wherein the control circuit switches the third switch from the off state to the on state in response to that a voltage of the third terminal has reached a certain voltage value.

7. The semiconductor device according to claim 1, wherein, in case where the smoothing capacitor is a first smoothing capacitor, the semiconductor device further comprises:
    a fourth terminal that is connected with the one end of the charging capacitor;
    a fifth terminal that is connected with the one terminal of the power supply wiring that supplies a third power supply voltage to a second circuit;

a sixth terminal that is connected with one end of a second smoothing capacitor that suppresses a fluctuation of the third power supply voltage;

a third switch that is provided between the fourth terminal and the fifth terminal; and a fourth switch that is provided between the fifth terminal and the sixth terminal, after switching the third switch from the off state to the on state, the control circuit switches the fourth switch from the off state to the on state in response to that the third power supply voltage has satisfied the certain conditions.

8. The semiconductor device according to claim 7, wherein, in case where the charging capacitor is a first charging capacitor, the semiconductor device further comprises:

a seventh terminal that is connected to one end of a second charging capacitor whose one end is connected to the fourth terminal;

an eighth terminal that is connected to a power source; and a fifth switch that is provided between the seventh terminal and the eighth terminal, the control circuit switches the fifth switch from the off state to the on state in response to an activation request for activating the second circuit.

9. The semiconductor device according to claim 1, wherein, in case where the smoothing capacitor is a first smoothing capacitor and the charging capacitor is a first charging capacitor, the semiconductor device further comprises:

a fourth terminal that is connected with the one end of the charging capacitor;

a fifth terminal that is connected with the one end of the power supply wiring that supplies a third power supply voltage to a second circuit;

a sixth terminal that is connected with one end of a second smoothing capacitor that suppresses a fluctuation of the third power supply voltage;

a seventh terminal that is connected to one end of a second charging capacitor whose one end is connected to the fourth terminal;

an eighth terminal that is connected to a power source;

a third switch that is provided between the fourth terminal and the fifth terminal; and a fourth switch that is provided between the seventh terminal and the eighth terminal, and the control circuit switches the fourth switch from the off state to the on state and switches the third switch from the off state to the on state in response to an activation request for activating the second circuit.

* * * * *